US012581815B2

(12) United States Patent
Tang et al.

(10) Patent No.: US 12,581,815 B2
(45) Date of Patent: Mar. 17, 2026

(54) DISPLAY SUBSTRATE AND DISPLAY APPARATUS

(71) Applicants: MIANYANG BOE OPTOELECTRONICS TECHNOLOGY CO., Ltd., Mianyang (CN); BOE Technology Group Co., Ltd., Beijing (CN)

(72) Inventors: Qing Tang, Beijing (CN); Qingsong Gu, Beijing (CN); Lin Xiong, Beijing (CN); Ning Ma, Beijing (CN); Danfeng Wang, Beijing (CN)

(73) Assignees: MIANYANG BOE OPTOELECTRONICS TECHNOLOGY CO., Ltd., Mianyang (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/022,754

(22) PCT Filed: Mar. 29, 2022

(86) PCT No.: PCT/CN2022/083768
§ 371 (c)(1),
(2) Date: Feb. 23, 2023

(87) PCT Pub. No.: WO2023/184163
PCT Pub. Date: Oct. 5, 2023

(65) Prior Publication Data
US 2024/0276800 A1 Aug. 15, 2024

(51) Int. Cl.
*H10K 59/131* (2023.01)
*G09G 3/3233* (2016.01)
*H10K 59/124* (2023.01)

(52) U.S. Cl.
CPC ......... *H10K 59/131* (2023.02); *G09G 3/3233* (2013.01); *H10K 59/124* (2023.02);
(Continued)

(58) Field of Classification Search
CPC ... H10K 59/131; H10K 59/124; G09G 3/3233
See application file for complete search history.

(56) References Cited

U.S. PATENT DOCUMENTS

2019/0130822 A1 5/2019 Jung et al.
2021/0126066 A1 4/2021 Hwang et al.
(Continued)

FOREIGN PATENT DOCUMENTS

CN 110444570 A 11/2019
CN 210535668 U 5/2020
(Continued)

*Primary Examiner* — Matthew L Reames
(74) *Attorney, Agent, or Firm* — Ling Wu; Stephen Yang; Ling and Yang Intellectual Property

(57) ABSTRACT

A display substrate includes a base substrate, a pixel circuit layer, a first planarization layer, at least one transparent conductive layer, and a plurality of first light-emitting elements. The base substrate includes a first display region and a second display region, wherein the first display region at least partially surrounds the second display region. The pixel circuit layer is located in the first display region, and includes a plurality of pixel circuits, wherein the plurality of pixel circuits include a plurality of first pixel circuits. A plurality of first light-emitting elements are located in the second display region. The first planarization layer is located on a side of the pixel circuit layer away from the base substrate, and is located in the first display region and the second display region.

18 Claims, 16 Drawing Sheets

(52) U.S. Cl.
CPC .............. *G09G 2300/0426* (2013.01); *G09G 2300/0819* (2013.01); *G09G 2300/0842* (2013.01); *G09G 2310/08* (2013.01)

(56) References Cited

U.S. PATENT DOCUMENTS

| | | | |
|---|---|---|---|
| 2021/0408146 A1 | 12/2021 | Ying et al. | |
| 2022/0302228 A1 | 9/2022 | Choi et al. | |

FOREIGN PATENT DOCUMENTS

| | | | |
|---|---|---|---|
| CN | 111490066 A | 8/2020 | |
| CN | 112271268 A | 1/2021 | |
| CN | 114005859 A | 2/2022 | |
| CN | 114080690 A | 2/2022 | |
| CN | 114171565 A | 3/2022 | |

DISPLAY SUBSTRATE AND DISPLAY APPARATUS

CROSS-REFERENCE TO RELATED APPLICATION

The present application is a U.S. National Phase Entry of International Application No. PCT/CN2022/083768 having an international filing date of Mar. 29, 2022. The above-identified application is hereby incorporated by reference.

TECHNICAL FIELD

The present disclosure relates to, but is not limited to, the field of display technology, in particular to a display substrate and a display apparatus.

BACKGROUND

An Organic light emitting Diode (OLED) and a Quantum dot light-emitting Diode (QLED) are active light-emitting display devices and have advantages of self-illumination, a wide viewing angle, a high contrast ratio, low power consumption, an extremely high reaction speed, lightness and thinness, bendability, and a low cost, etc.

SUMMARY

The following is a summary of subject matters described herein in detail. The summary is not intended to limit the protection scope of claims.

Embodiments of the present disclosure provide a display substrate and a display apparatus.

In one aspect, an embodiment of the present disclosure provides a display substrate, which includes a base substrate, a pixel circuit layer, a first planarization layer, at least one transparent conductive layer and a plurality of first light-emitting elements. The base substrate includes a first display region and a second display region, wherein the first display region at least partially surrounds the second display region. The pixel circuit layer is located in the first display region, the pixel circuit layer includes a plurality of pixel circuits, and the plurality of pixel circuits includes a plurality of first pixel circuits. A plurality of first light-emitting elements located in the second display region. The first planarization layer located on a side of the pixel circuit layer away from the base substrate, and is located in the first display region and the second display region. At least one transparent conductive layer is located on a side of the first planarization layer away from the base substrate. Among them, the transparent conductive layer comprises a plurality of first transparent conductive lines and at least one auxiliary structure, and the plurality of first light-emitting elements and the plurality of first pixel circuits are coupled through the plurality of first transparent conductive lines. An orthographic projection of the auxiliary structure on the base substrate is overlapped with an orthographic projection of at least one of the plurality of pixel circuits on the base substrate.

In some exemplary implementations, the display substrate further comprises: a first conductive layer located between the pixel circuit layer and the first planarization layer, wherein the first conductive layer includes at least one shield electrode electrically connected with at least one of the plurality of pixel circuits, and an orthographic projection of the auxiliary structure on the base substrate is overlapped with an orthographic projection of the shield electrode on the base substrate.

In some exemplary implementations, the pixel circuit layer includes a second conductive layer, wherein the second conductive layer include a first power supply line, and the shield electrode is electrically connected with the first power supply line.

In some exemplary implementations, the auxiliary structure is electrically connected with the shield electrode.

In some exemplary implementations, the pixel circuit at least includes a drive transistor, a threshold compensation transistor, and a first reset transistor, wherein the drive transistor, the threshold compensation transistor, and the first reset transistor all electrically connected with a first node; and an orthographic projection of the shield electrode on the base substrate is configured to cover an orthographic projection of the first node of the pixel circuit on the base substrate.

In some exemplary implementations, the orthographic projection of the shield electrode on the base substrate is an irregular shape.

In some exemplary implementations, a second planarization layer is arranged between the first conductive layer and the second conductive layer, and the first conductive layer is electrically connected to the second conductive layer through a first via penetrating the second planarization layer; an orthographic projection of at least one of the plurality of first transparent conductive lines on the base substrate is overlapped with an orthographic projection of the first via on the base substrate.

In some exemplary implementations, the first transparent conductive lines include an edge transparent conductive line, which is adjacent to the auxiliary structure.

In some exemplary implementations, the auxiliary structure is located between two edge transparent conductive lines.

In some exemplary implementations, a spacing between the auxiliary structure and the adjacent edge transparent conductive lines is greater than or equal to 2 microns and less than or equal to 3 microns.

In some exemplary implementations, the at least one auxiliary structure includes a plurality of auxiliary blocks arranged regularly.

In some exemplary implementations, a plurality of auxiliary blocks of the auxiliary structure are arranged in an array, and the plurality of auxiliary blocks are substantially the same in shape and size.

In some exemplary implementation, an orthographic projection of the plurality of auxiliary blocks on the base substrate is rectangular.

In some exemplary implementations, a plurality of auxiliary blocks of the auxiliary structure are arranged in a ring.

In some exemplary implementations, at least one auxiliary block of the auxiliary structure is electrically connected with the first power supply line.

In some exemplary implementations, at least two adjacent auxiliary blocks of the auxiliary structure are connected through a connection line.

In some exemplary implementations, a plurality of auxiliary blocks of the auxiliary structure are divided into a plurality of groups, each of which includes at least two auxiliary blocks, and the auxiliary blocks within one group are connected through a connection line.

In some exemplary implementations, an orthographic projection of the at least one auxiliary structure on the base substrate is ring-shaped or mesh-shaped.

In some exemplary implementations, the plurality of pixel circuits further includes a plurality of second pixel circuits located in the first display region; the display substrate further includes a plurality of second light-emitting elements located in the first display region; at least one of the plurality of second pixel circuits is connected with at least one of the plurality of second light-emitting elements, and the at least one of the second pixel circuits is configured to drive the at least one of the second light-emitting elements.

In another aspect, an embodiment of the present disclosure provides a display apparatus, which includes the aforementioned display substrate.

Other aspects may be understood upon reading and understanding the drawings and detailed description.

BRIEF DESCRIPTION OF DRAWINGS

Accompanying drawings are used for providing further understanding for technical solutions of the present disclosure, constitute a part of the specification, and together with the embodiments of the present disclosure, are used for explaining the technical solutions of the present disclosure but not to constitute limitations on the technical solutions of the present disclosure; Shapes and sizes of one or more components in the drawings do not reflect true scales, and are only intended to schematically describe contents of the present disclosure.

DETAILED DESCRIPTION

Figure 1:
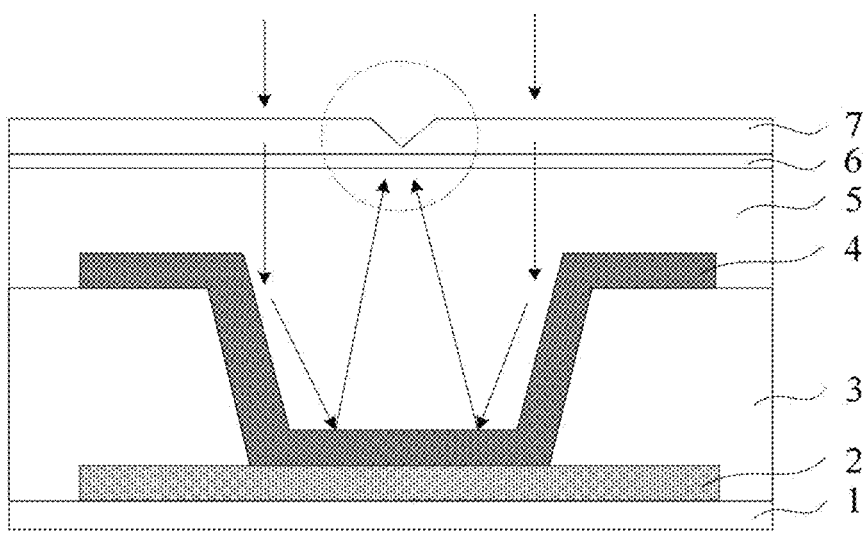
FIG. 1 is a schematic diagram showing a preparation for a display substrate.

The embodiments of the present disclosure will be described below in combination with the drawings in detail. Implementations may be implemented in a plurality of different forms. Those of ordinary skill in the art may easily understand such a fact that manners and contents may be transformed into other forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity. In the present disclosure, "a plurality of" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In this specification, "electrical connection" or "coupling" includes a case in which constitute essential factors are connected together through an element having some certain electrical effect. The "element having some electrical function" is not particularly limited as long as electrical signals between the connected constituent elements may be transmitted. Examples of the "element having some electrical function" not only include an electrode and a wiring, but also include a switch element such as a transistor, a resistor, an inductor, a capacitor, other elements with a plurality of functions, etc.

In the specification, a transistor refers to an element which at least includes three terminals, i.e., a gate, a drain, and a source. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current changes during work of a circuit, or the like, functions of the "source electrode" and the "drain electrode" may sometimes be exchangeable. Therefore, the "source electrode" and the "drain electrode" may be exchangeable in the specification. In addition, the gate may also be referred to as a control electrode.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

A "light transmission rate" in the present disclosure refers to an ability of light to pass through a medium, and is a percentage of the luminous flux passing through a transparent or translucent body to its incident luminous flux.

In the present disclosure, "about" and "substantially" refer to a case that a boundary is not defined strictly and a process and measurement error within a range is allowed. In the present disclosure, "substantially the same" is a case where values differ by less than 10%.

In the present disclosure, "line length" represents a length in an extension direction of the line, and "line width" represents a length in a direction intersecting the extension direction of the line (e.g., a direction perpendicular to the extension direction) in the plane in which the line is located.

In some implementations, the display substrate may include an under-screen camera region and a normal display region located around the under-scree camera region. Only a light-emitting element may be remained in an under-screen camera region, and a pixel circuit driving the light-emitting element in the under-screen camera region is arranged in the normal display region, and the light-emitting element in the under-screen camera region and the pixel circuit in the normal display region are electrically connected through a transparent conductive line arranged in a transparent conductive layer. However, because a surrounding environment of an edge transparent conductive line of the transparent conductive line layer is relatively empty, it is easy to be exposed to more exposure amount in the exposure process, which easily leads to a thinning of a line width of the edge transparent conductive line. Among them, the edge transparent conductive line may refer to a transparent conductive line having an empty region on at least one side of a line width direction. The length of the empty region along the line width direction of the transparent conductive line may be greater than or equal to 8 microns. That is, a spacing between the at least one side of the edge transparent conductive line in the line width direction and the adjacent lines may be greater than or equal to 8 microns. For example, one side of the edge transparent conductive line may be provided with adjacent transparent conductive lines, and a spacing between the edge transparent conductive lines and the adjacent transparent conductive lines may be about 2 microns to 3 microns, such as 2.5 microns; and the other side of the edge transparent conductive line may have an empty region. In another example, the edge transparent conductive line have empty region respectively on opposite sides in the line width direction.

In addition, in some implementations, there are cases where the line width of the transparent conductive line becomes thinner or broken due to a reflective focusing effect of the conductive layer in the exposure process. FIG. 1 is a schematic diagram showing a preparation for a display substrate. In some implementations, the display substrate may include a base substrate 1, and a second conductive layer 2, a second planarization layer 3, a first conductive layer 4, a first planarization layer 5 and a transparent conductive layer which are arranged on the base substrate 1.

FIG. 1 is a schematic diagram of a principle of an exposure process during a preparation process of the transparent conductive layer. In some implementations, the preparation process of the transparent conductive layer includes: forming transparent conductive thin film 6 on the first planarization layer 5; forming a photoresist thin film 7 on the transparent conductive film 6; exposing the photoresist thin film 7 by using a mask plate as a mask, so that the photoresist thin film forms a remained part of the photoresist and a part to be removed of the photoresist; and after the exposure process, performing a development process, in which the part to be removed of the photoresist is removed to form a photoresist pattern. The transparent conductive film 6 is etched with the photoresist pattern as a mask to form a transparent conductive layer. However, as shown in FIG. 1, the first conductive layer 4 may be lapped with the second conductive layer 2 through a via, and a lapping structure of the first conductive layer 4 in the via may form a bowl-like concave part. A opening direction of the concave part faces away from the base substrate 1. Under the irradiation of light, the concave part can form a focusing effect similar to a concave mirror. In the exposure process, the first conductive layer 4 made of a metal material reflects light and converges light to the remained part of photoresist located above the concave part of the first conductive layer 4, so that this part of the photoresist is exposed or partially exposed and washed away after development, so that the transparent conductive line formed after etching the transparent conductive film with the photoresist pattern as a mask is easy to break or become thinner. Therefore, at a via position of the second planarization layer 3, due to the reflection and focusing effect of the first conductive layer 4 in the exposure process, the photoresist film at the via position will become thinner, resulting in a disconnection or thinning of the finally formed transparent conductive line, which causes dark spots of the display.

The present embodiment provides a display substrate, which includes a base substrate, a pixel circuit layer, a first planarization layer, at least one transparent conductive layer and a plurality of first light-emitting elements. The base substrate includes a first display region and a second display region, wherein the first display region at least partially surrounds the second display region. The pixel circuit layer is located in the first display region, and includes a plurality of pixel circuits, wherein the plurality of pixel circuits includes a plurality of first pixel circuits. A plurality of first light-emitting elements located in the second display region. The first planarization layer is located on a side of the pixel circuit layer away from the base substrate, and is located in the first display region and the second display region. At least one transparent conductive layer is located on a side of the first planarization layer away from the base substrate. The transparent conductive layer includes a plurality of first transparent conductive lines and at least one auxiliary structure. The plurality of first light-emitting elements and the plurality of first pixel circuits are coupled through the plurality of first transparent conductive lines. An orthographic projection of the auxiliary structure on the base substrate is overlapped with an orthographic projection of at least one of the pixel circuits on the base substrate.

The display substrate provided in the present embodiment can improve the exposure environment of the exposure process of the transparent conductive layer by providing an auxiliary structure in the transparent conductive layer, thereby improving a disconnection or a thinning of a line width of the first transparent conductive line of the transparent conductive layer.

In some exemplary implementations, the display substrate may further include a first conductive layer between the pixel circuit layer and the first planarization. The first conductive layer may include at least one shield electrode, which may be electrically connected with at least one pixel circuit. An orthographic projection of the auxiliary structure on the base substrate may be overlapped with an orthographic projection of the shield electrode on the base substrate. In this example, a disconnection and a thinning of a line width of the transparent conductive line due to a reflection and focusing effect of the shield electrode in the exposure process may be improved through the auxiliary structure, thereby improving a yield of the display substrate.

In some exemplary implementations, the pixel circuit layer may include a second conductive layer which may include a first power supply line. The shield electrode may be electrically connected to the first power supply line. In some examples, the auxiliary structure may be electrically connected to the shield electrode. Among them, the auxiliary structure can be electrically connected with a first power supply line through the shield electrode. However, this embodiment is not limited thereto. For example, the auxiliary structure may be directly connected to the first power supply line, or the auxiliary structure may be connected to other signal lines transmitting direct current signals, or the auxiliary structure may not be electrically connected.

In some exemplary implementations, the pixel circuit may at least include a drive transistor, a threshold compensation transistor and a first reset transistor. The drive transistor, the threshold compensation transistor and the first reset transistor are all electrically connected to a first node. An orthographic projection of the shield electrode on the base substrate may be configured to cover an orthographic projection of the first node of the pixel circuit of the display substrate on the base substrate. In some examples, an orthographic projection of the shield electrode on the base substrate may be an irregular shape. However, this embodiment is not limited thereto.

In some exemplary implementation, a second planarization layer may be arranged between the first conductive layer and the second conductive layer, and the first conductive layer may be electrically connected with the second conductive layer through a first via penetrating the second planarization layer. An orthographic projection of at least one of the plurality of first transparent conductive lines on the base substrate may overlap with an orthographic projection of the first via on the base substrate.

In some exemplary implementations, the first transparent conductive lines may include an edge transparent conductive line, which may be adjacent to the auxiliary structure. In this example, by arranging the auxiliary structure adjacent to the edge transparent conductive line, excessive exposure amount of the edge transparent conductive line in the preparation process may be reduced, and a disconnection and a thinning of a line width of the edge transparent conductive line may be improved, thereby improving a yield of the display substrate.

In some exemplary implementations, the auxiliary structure may be located between two edge transparent conductive lines. For example, the auxiliary structure can be located between the two edge transparent conductive lines, thus improving a disconnection and a thinning of a line width of the edge transparent conductive line, and improving a yield.

In some exemplary implementations, a spacing between the auxiliary structure and the adjacent edge transparent conductive line may be greater than or equal to 2 microns and less than or equal to 3 microns. For example, the spacing between the auxiliary structure and the adjacent edge transparent conductive line can be about 2.5 microns.

In some exemplary implementations, the at least one auxiliary structure may include a plurality of auxiliary blocks arranged regularly. In some examples, a plurality of auxiliary blocks of the auxiliary structure may be arranged in an array and shapes and sizes of the plurality of auxiliary blocks may be substantially the same. For example, an orthographic projection of the plurality of auxiliary blocks on the base substrate may be rectangular. In other examples, a plurality of auxiliary blocks of the auxiliary structure may be arranged in a ring, such as in a rectangular ring. For example, an orthographic projection of the plurality of auxiliary block on the base substrate may be rectangular or L-typed. However, this embodiment is not limited thereto. For example, an orthographic projection of the auxiliary block on the base substrate may be of another shape, such as a circle, an ellipse, a quadrilateral, a pentagon, or a hexagon.

In some exemplary implementations, at least one auxiliary block of the auxiliary structure may be electrically connected with the first power supply line. For example, the at least one auxiliary block may be electrically connected to the first power supply line through a shield electrode.

In some exemplary implementations, at least two adjacent auxiliary blocks of the auxiliary structure may be connected through a connection line. In some examples, a plurality of auxiliary blocks of the auxiliary structure may be divided into a plurality of groups, each of which may include at least two auxiliary blocks, and the auxiliary blocks within one group may be connected through a connection line. Among them, the plurality of auxiliary blocks connected through the connection line may be electrically connected to a first power supply line, or the plurality of auxiliary blocks connected through the connection line may not be electrically connected to other signal lines.

In some exemplary implementations, an orthographic projection of the at least one auxiliary structure on the base substrate may be ring-shaped or mesh-shaped. In this example, the one auxiliary structure may be of an integral structure. The auxiliary structure may be electrically connected to the first power supply line, or may not be electrically connected. However, this embodiment is not limited thereto.

Solutions of the embodiment will be described below through some examples. A display substrate which is applicable for full-screen and under-screen photographing technology as an example will be described as below. However, this embodiment is not limited thereto.

Figure 2:
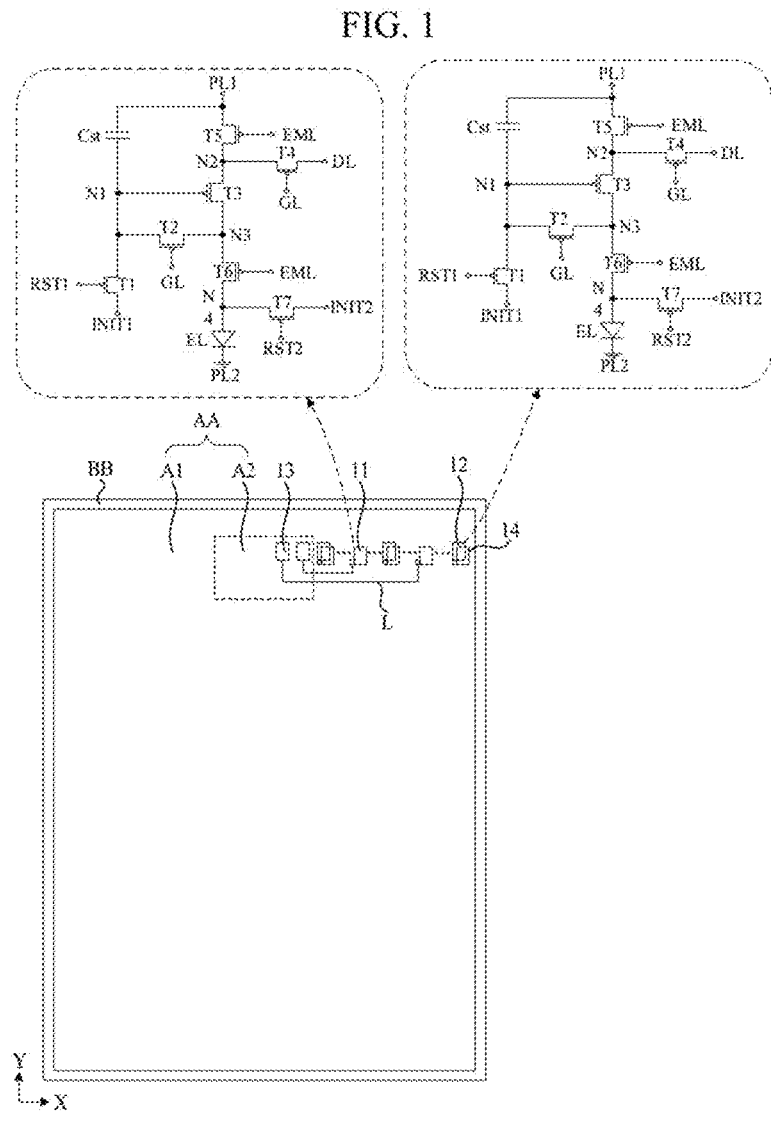
FIG. 2 is a schematic diagram of a display substrate according to at least one embodiment of the present disclosure.
Figure 3:
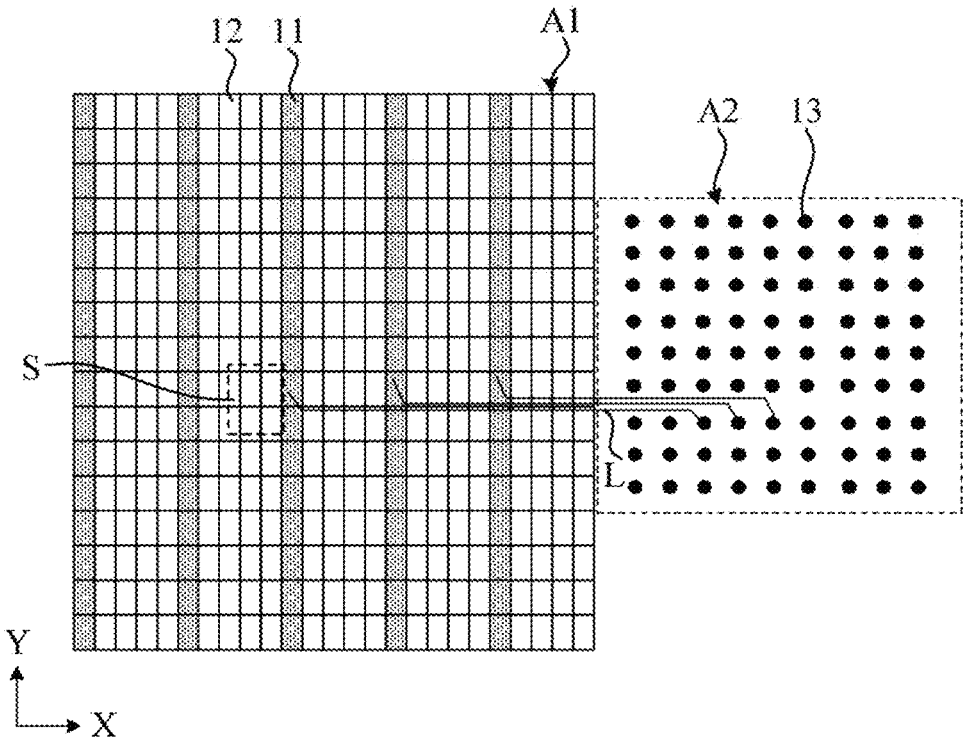
FIG. 3 is a partial schematic view of a display substrate according to at least one embodiment of the present disclosure.

FIG. 2 is a schematic diagram of a display substrate according to at least one embodiment of the present disclosure. FIG. 3 is a partial schematic view of a display substrate according to at least one embodiment of the present disclosure. In some exemplary implementation, as shown in FIG. 2 and FIG. 3, the display substrate may include a display region AA and a peripheral region BB. The peripheral region BB is a non-display region. The display region AA may include a first display region A1 and a second display region A2. For example, a hardware such as a photosensitive sensor (such as a camera) is arranged on a side of the display substrate, and an orthographic projection of the photosensitive sensor on the display substrate is overlapped with the second display region A2. The second display region A2 may be a light-transmissive display region and may be referred to as a Under Display Camera (UDC) region; the first display region A1 may be a normal display region. For example, the first display region A1 is non-light-transmissive and only for display. The display substrate of the present embodiment can lay a solid foundation for the implementation of the true full screen.

In some exemplary implementation, as shown in FIG. 2, the display region AA may be a rectangle, e.g., a rounded rectangle. The second display region A2 may be a rectangle, e.g., a rounded rectangle. However, this embodiment is not limited thereto. For example, the second display region A2 may be a circle, other quadrilateral or pentagon, etc.

In some exemplary implementations, as shown in FIG. 2, the display substrate may include a base substrate and a plurality of sub-pixels located on the base substrate. The plurality of sub-pixels includes a plurality of first sub-pixels and a plurality of second sub-pixels. At least one first sub-pixel includes a first pixel circuit 11 and a first light-emitting element 13, and at least one second sub-pixel includes a second pixel circuit 12 and a second light-emitting element 14. Both the second pixel circuit 12 and the second light-emitting element 14 are located in the first display region A1, the first pixel circuit 11 is located in the first display region A1, and the first light-emitting element 13 is located in the second display region A2. The plurality of first pixel circuit 11 may be distributed among the plurality of second pixel circuit 12 at intervals. For example, the second pixel circuit 12 may be referred to as an in-situ pixel circuit and the first pixel circuit 11 may be referred to as a non-in-situ pixel circuit. Within the second display region A2, between the adjacent first light-emitting elements 13 there is a light-transmissive sub-region, and the region where the first light-emitting element 13 is located is a display sub-region. No pixel circuit is arranged in the second display region A2, only a light-emitting element is arranged in the second display region A2, and a pixel circuit for driving the light-emitting element in the second display region A2 is arranged in the first display region A1. That is, a light transmittance of the second display region A2 may be improved by separating the light-emitting element from the pixel circuit.

In some exemplary implementation, a shape of the light-emitting element of the sub-pixel may be a rectangle, a rhombus, a pentagon, or a hexagon. When a pixel unit includes three sub-pixels, light-emitting elements of the three sub-pixels may be arranged side by side horizontally, side by side vertically, or in a manner of delta. When a pixel unit includes four sub-pixels, light-emitting elements of the four sub-pixels may be arranged side by side horizontally, side by side vertically, or in a manner to form a square. However, this embodiment is not limited thereto.

In some exemplary implementation, as shown in FIG. 2, at least one second pixel circuit 12 of the plurality second pixel circuits 12 may be connected with at least one second light-emitting element 14 of the plurality of second light-emitting elements 14, and an orthographic projection of at least one second pixel circuit 12 on a base substrate is at least partially overlapped with an orthographic projection of at least one second light-emitting element 14 on the base substrate. At least one second pixel circuit 12 may be configured to provide a drive signal to a second light-emitting element 14 with which the second pixel circuit 12 is electrically connected to drive the second light-emitting element 14 to emit light.

In FIG. 2, taking an example that a first pixel circuit 11 for driving the first light-emitting element 13 to emit light is located in the first display region A1, the display substrate in this example may adopt a pixel circuit compression solution in which the size of the pixel circuit in the first direction X is reduced so that the first pixel circuits 11 and the second pixel circuits 12 can be placed in the first direction X, and the first pixel circuits 11 may be dispersed in the second pixel circuits 12. For example, the first direction X is a row direction, and in the same row of the pixel circuit, the first pixel circuits 11 may be arranged at intervals in the second pixel circuits 12. However, this embodiment is not limited thereto. For example, the first pixel circuit 11 may be located in the peripheral region, thereby implementing an solution of external pixel circuit.

In some exemplary implementations, as shown in FIG. 2, the first display region A1 may be located on at least one side of the second display region A2. For example, the first display region A1 may surround the second display region A2. That is, the second display region A2 may be surrounded by the first display region A1. In other examples, the second display region A2 may be arranged at other locations, which may be, for example, located at a top middle position of the base substrate, or located at an upper left corner position or an upper right corner position of the base substrate. However, this embodiment is not limited thereto.

In some exemplary implementations, as shown in FIG. 2 and FIG. 3, at least one first pixel circuit 11 of the plurality of first pixel circuits 11 may be electrically connected to at least one first light-emitting-element 13 of the plurality of first light-emitting elements 13 through a transparent conductive line L. One end of the transparent conductive line L is electrically connected to the first pixel circuit 11, and the other end is electrically connected with the first light-emitting element 13. The transparent conductive line L may extend from the first display region A1 to the second display region A2. For example, the transparent conductive line L may extend from the first display region A1 to the second display region A2 along the first direction X; alternatively, the transparent conductive line L may first extend in the first display region A1 along the second direction Y, and then extend along the first direction X to the second display region A2. However, this embodiment is not limited thereto.

In some exemplary implementations, the transparent conductive line L may be made of a transparent conductive material, which may be, for example, made of a conductive oxide material, such as Indium tin Oxide (ITO). However, this embodiment is not limited thereto. In some examples, the transparent conductive lines L may be arranged in a transparent conductive layer, or the plurality of transparent conductive lines L may be arranged in two or three transparent conductive layers. Each of the transparent conductive lines L may be connected to a first pixel circuit 11 and a first light-emitting element 13. Alternatively, one first pixel circuit 11 and one first light-emitting element 13 may be electrically connected by sequentially connecting the plurality of transparent conductive lines L located in different transparent conductive layers.

In some exemplary implementations, at least one first pixel circuit 11 may be configured to provide a drive signal to at least one first light-emitting element 13 electrically connected thereto to drive the first light-emitting element 13 to emit light. The first pixel circuit 11 and first light-emitting element 13 are located in the different region, and an orthographic projection of the first pixel circuit 11 on the base substrate may be not overlapped with an orthographic projection of the at least one first light-emitting element 13 on the base substrate. As shown in FIG. 2, the first light-emitting element 13 and the first pixel circuit 11 electrically connected thereto may be located in a same row. That is, a drive signal of the first light-emitting element 13 comes from the first pixel circuit 11 in the same row. For example, pixel circuits of sub-pixels in the same row are electrically connected with a same gate line. However, this embodiment is not limited thereto. For example, the first light-emitting element and the first pixel circuit electrically connected thereto may not be in the same row.

Figure 4:
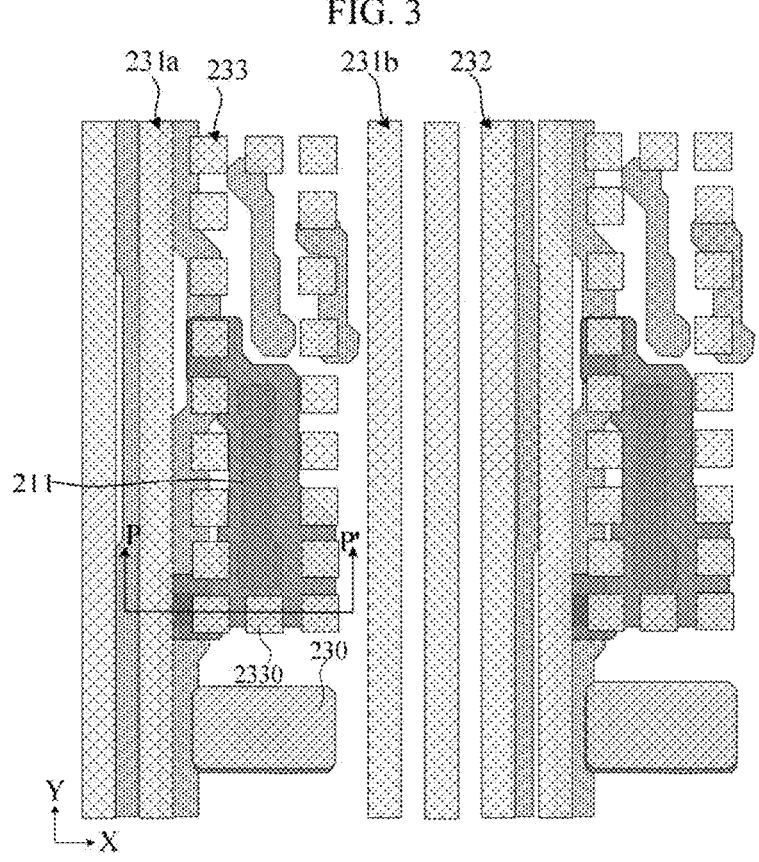
FIG. 4 is a schematic top view of a partial film layer of a display substrate according to at least one embodiment of the present disclosure.
Figure 5:
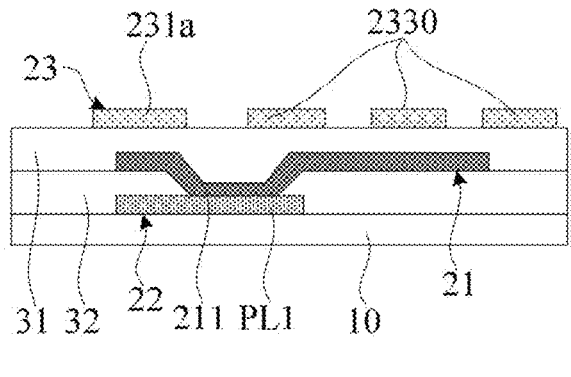
FIG. 5 is a cross-sectional view of a part taken along a direction P-P' in FIG. 4.

FIG. 4 is a schematic top view of a partial film layer of a display substrate according to at least one embodiment of the present disclosure. FIG. 4 may be a partial enlarged schematic diagram of a region S in FIG. 3. FIG. 5 is a cross-sectional view of a part taken along a direction P-P' in FIG. 4. In this example, it is illustrated by taking a transparent conductive layer as an example. However, this embodiment is not limited thereto. For example, the display substrate may include a plurality of transparent conductive layers. A plurality of film layer structures on a side of the second conductive layer close to the display substrate and a plurality of film layers on a side of the transparent conductive layer away from the base substrate are omitted in FIG. 4 and FIG. 5.

In some exemplary implementation, as shown in FIG. 4 and FIG. 5, in a direction perpendicular to a display substrate, a display substrate of the first display region A1 may include: a base substrate 10, and a pixel circuit layer (for example, including a second conductive layer 22), the second planarization layer 32, a first conductive layer 21, a first planarization layer 31, and a transparent conductive layer 23 that are arranged on the base substrate 10. A third planarization layer, an anode layer, a pixel definition layer, an organic light-emitting layer, and cathode layer may further be sequentially arranged on a side of the transparent conductive layer 23 away from the base substrate. In some examples, the pixel circuit layer may include a semiconductor layer, a first insulation layer, a first gate metal layer, a second insulation layer, a second gate metal layer, a third insulation layer and a second conductive layer which are arranged on the base substrate 10 sequentially. In some examples, the second conductive layer 22 further may be referred to as a first source-drain metal layer, and the first conductive layer 21 may further be referred as a second source-drain metal layer. The first planarization layer 31 and the second planarization layer 32 may be organic material layers. However, this embodiment is not limited thereto.

Figure 6:
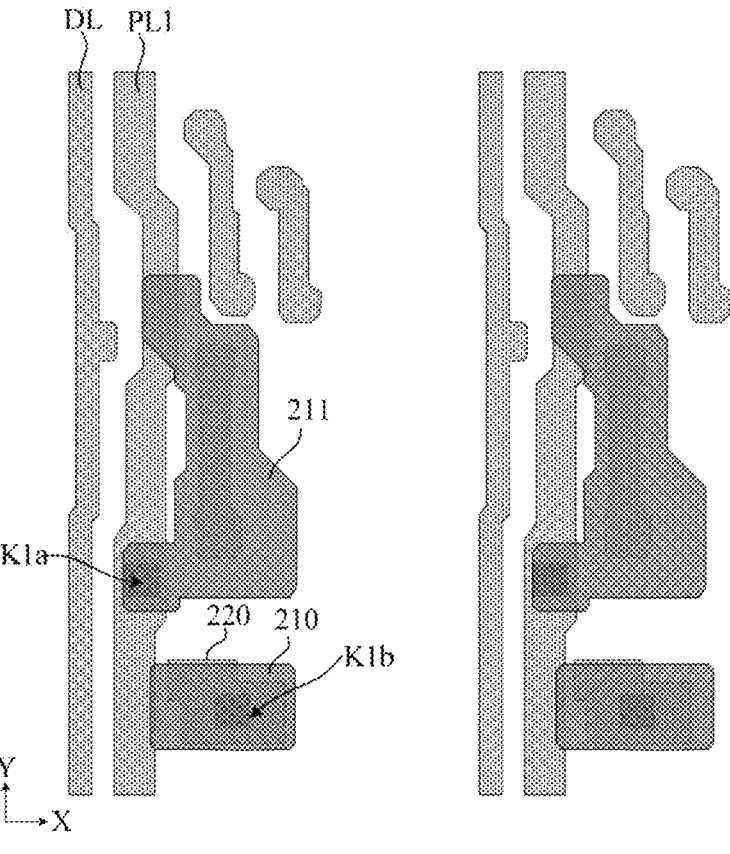
FIG. 6 is a partial schematic top view of a display substrate after a second conductive layer is formed in FIG. 4.
Figure 7:
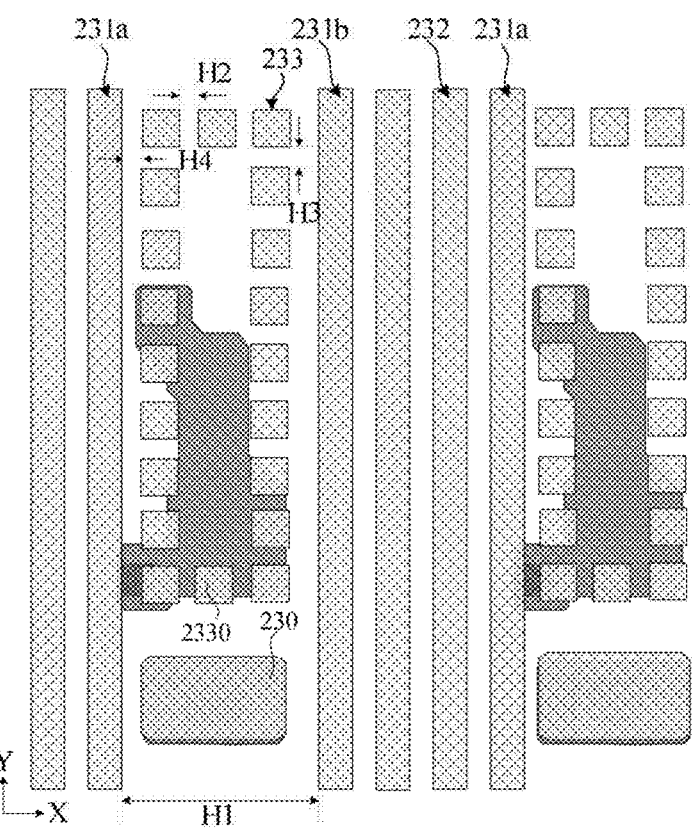
FIG. 7 is a partial schematic top view of a display substrate after a transparent conductive layer is formed in FIG. 4.

FIG. 6 is a partial schematic top view of a display substrate after a first conductive layer is formed in FIG. 4. The first conductive layer 21 and the second conductive layer 22 are illustrated in FIG. 6. FIG. 7 is a partial schematic top view of a display substrate after a transparent conductive layer is formed in FIG. 4. The first conductive layer 21 and the transparent conductive layer 23 are illustrated in FIG. 7.

In some exemplary implementations, as shown in FIG. 4 to FIG. 7, the second conductive layer 22 may at least include a plurality of data lines (e.g., data lines DL), a plurality of first power supply lines (e.g., first power supply lines PL1), and a plurality of connection electrodes (e.g., including first anodic connection electrodes 220). The data line DL and the first power supply line PL1 may extend along a second direction Y, and the data line DL is adjacent to the first power supply line PL1 in a first direction X. The first direction X intersects the second direction Y, for example, the first direction X and the second direction Y are perpendicular to each other.

In some exemplary implementations, as shown in FIG. 4 to FIG. 7, the first conductive layer 21 may at least include a plurality of shield electrodes 211, and a plurality of connection electrodes (e.g., including second anode connection electrodes 210). The second anode connection electrode 210 may be electrically connected with the first anode connection electrode 220 through a first via K1b opened on a second planarization layer 32. The shield electrode 211 may be electrically connected to the first power supply line PL1 through a first via K1a opened on a second planarization layer 32.

In some examples, as shown in FIG. 4 to FIG. 7, the transparent conductive layer 23 may at least include a plurality of first transparent conductive lines (e.g. edge transparent conductive lines 231a and 231b, and non-edge transparent conductive lines 232), and an auxiliary structure 233. Among them, the edge transparent conductive lines 231a and 231b have an empty region on a side in a direction of a line width, and an orthographic projection of the edge transparent conductive lines 231a on the base substrate may be overlapped with an orthographic projection of the first via K1a on the base substrate. The non-edge transparent conductive line 232 has adjacent lines on both sides in the direction of the track width. For example, the non-edge transparent conductive line 232 may be located between the edge transparent conductive lines 231a and 231b. One side of the edge transparent conductive line 231a may be adjacent to the non-edge transparent conductive line 232 and an auxiliary structure 233 may be arranged in the empty region on the other side. The auxiliary structure 233 may be located between the edge transparent conductive lines 231a and 231b. The auxiliary structure 233 of this example may not be electrically connected and is a Dummy structure.

In some examples, as shown in FIG. 7 the edge transparent conductive lines 231a and 231b and the non-edge transparent conductive lines 232 may both extend along the second direction Y. The line widths of the edge transparent conductive lines and the non-edge transparent conductive lines may be substantially the same, which may be, for example, about 2.0 microns to 2.5 microns, such as, about 2.3 microns. However, this embodiment is not limited thereto. For example, a line width of the edge transparent conductive line may be greater than a line width of the non-edge transparent conductive line.

In some examples, as shown in FIG. 7, a spacing between the non-edge transparent conductive lines 232 and adjacent transparent conductive lines in the first direction X may be substantially the same, which may be, for example, about 2.0 microns to 2.5 microns, such as, about 2.2 microns. A length H1 of an empty region between the edge transparent conductive lines 231a and 231b in the first direction X may be greater than or equal to 8 microns, which may be, for example, about 8 microns or 9 microns.

In some examples, as shown in FIG. 7, the auxiliary structure 233 may be located within the empty region between the edge transparent conductive lines 231a and 231b. The auxiliary structure 233 may include a plurality of auxiliary blocks 2330 arranged in a ring (e.g. rectangular ring). The plurality of auxiliary blocks 2330 may be sequentially arranged along the second direction Y and close to the edge transparent conductive lines 231a and 231b. An orthographic projection of a portion of the auxiliary blocks 2330 on the base substrate may be overlapped with an orthographic projection of the shield electrode 211 on the base substrate, and an orthographic projection of the other portion of the auxiliary blocks 2330 on the base substrate may not overlapped with an orthographic projection of the shield electrode 211 on the base substrate. In other examples, the plurality of auxiliary blocks 2330 of the auxiliary structure 233 may be arranged in another shape, such as a circular ring, elliptical ring, or the like.

In some examples, as shown in FIG. 7, shapes and sizes of the plurality of auxiliary blocks 2330 of the auxiliary structure 233 may be substantially the same. An orthographic projection of the auxiliary blocks 2330 on the base substrate may be rectangular. A length of the auxiliary block 2330 along the first direction X may be greater than or equal to 1 micron and less than or equal to 2 microns, and a length along the second direction Y may be greater than or equal to 1 micron and less than or equal to 2 microns. For example, the orthographic projection of the auxiliary block 2330 on the base substrate may be a square of 1 micron×1 micron size or a square of 2 microns×2 microns size. However, a shape of the auxiliary block is not limited in this embodiment. The orthographic projection of the auxiliary block on the base substrate may be of another shape, such as a circle, an ellipse, a pentagon, or a hexagon. The auxiliary structure of this example may include a plurality of auxiliary blocks which are not electrically connected, and the size of the auxiliary blocks is not big, which can avoid influence on signal transmission of the first transparent conductive line.

In some examples, as shown in FIG. 7, the spacing H2 of the adjacent auxiliary blocks 2330 in the first direction X and the spacing H3 of the adjacent auxiliary blocks 2330 in the second direction Y may be substantially the same. For example, H2 and H3 may be greater than or equal to 1 micron, and less than or equal to 2 microns, which may be, for example, about 1 micron or 1.5 microns. The spacing between the auxiliary structure 233 and the adjacent edge transparent conductive lines 231a may be substantially the same as the spacing between the auxiliary structure 233 and the adjacent edge transparent conductive lines 231b. In FIG. 7, the spacing between the auxiliary structure 233 and the adjacent edge transparent conductive line 231a is the distance H4 between the auxiliary block 2330 of the auxiliary structure 233 closest to the edge transparent conductive line 231a and the edge transparent conductive line 231a. In some examples, H4 may be greater than or equal to 2 microns and less than or equal to 3 microns, which may be, for example, about 2 microns, or 2.5 microns, or 3 microns. However, this embodiment is not limited thereto.

In this example, by arranging the plurality of auxiliary blocks arranged in a ring within the empty region outside the first transparent conductive line, the exposure environment of the exposure process for preparing the transparent conductive layer can be improved (e.g., the reflection of light in the first via is reduced, and the exposure amount received by the first transparent conductive line is reduced), thereby affecting the line width of the first transparent conductive line, and further improving the disconnection or the thinning of the first transparent conductive line due to the reflection and focusing effect of the first conductive layer in the exposure process.

Figure 8:
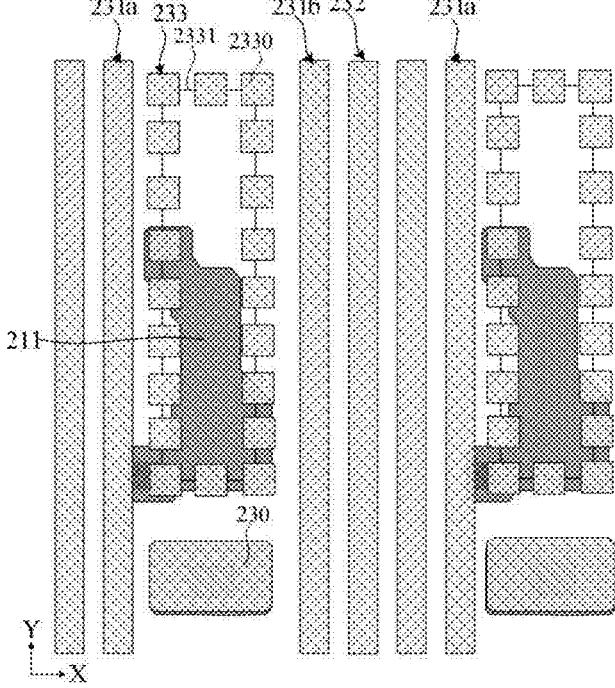
FIG. 8 is another schematic top view of a partial film layer of a display substrate according to at least one embodiment of the present disclosure.

FIG. 8 is another schematic top view of a partial film layer of a display substrate according to at least one embodiment of the present disclosure. Only the first conductive layer and the transparent conductive layer are illustrated and other film layers are omitted in FIG. 8. In some examples, as shown in FIG. 8, the empty region between the edge transparent conductive lines 231a and 231b is provided with an auxiliary structure 233. The auxiliary structure 233 includes a plurality of auxiliary blocks 2330 arranged in a rectangular ring. The adjacent auxiliary blocks 2330 of the auxiliary structure 233 may be connected by a connection line 2331. In this example, a connection line 2331 may be sequentially connected with the plurality of auxiliary blocks 2330 along the rectangular ring. Rest of the structure of the display substrate according to this embodiment may be referred to descriptions of the aforementioned embodiments, and will not be repeated here.

Figures 9, 10:
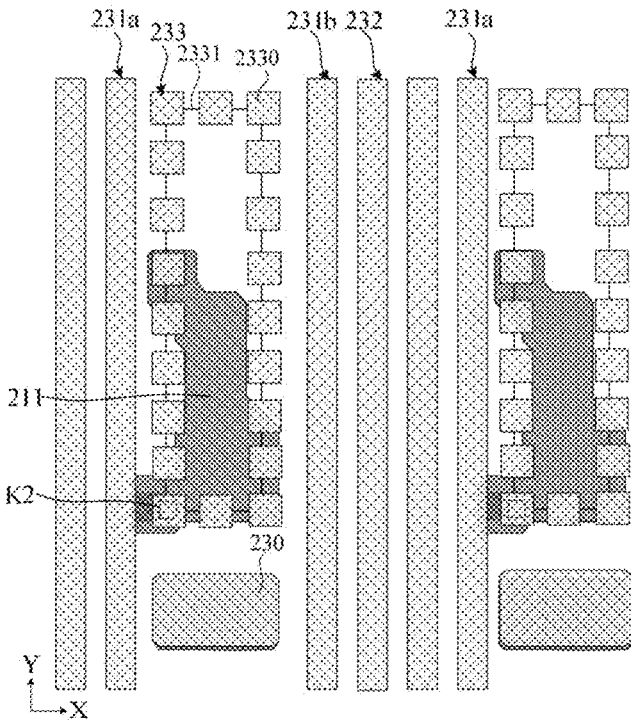
FIG. 9 is another schematic top view of a partial film layer of a display substrate according to at least one embodiment of the present disclosure.
FIG. 10 is another schematic top view of a partial film layer of a display substrate according to at least one embodiment of the present disclosure.

FIG. 9 is another schematic top view of a partial film layer of a display substrate according to at least one embodiment of the present disclosure. Only the first conductive layer and the transparent conductive layer are illustrated and other film layers are omitted in FIG. 9. In some examples, as shown in FIG. 9, the empty region between the edge transparent conductive lines 231*a* and 231*b* is provided with an auxiliary structure 233. The auxiliary structure 233 includes a plurality of auxiliary blocks 2330 arranged in a rectangular ring. The adjacent auxiliary blocks 2330 of the auxiliary structure 233 may be connected by a connection line 2331. In this example, a connection line 2331 may be sequentially connected with the plurality of auxiliary blocks 2330 along the rectangular ring. At least one auxiliary block 2330 having an orthographic projection on the base substrate which is overlapped with an orthographic projection of the shield electrode 211 of the first conductive layer on the base substrate may be electrically connected to the shield electrode 211 through a second via K2 opened in the first planarization layer. The shield electrode 211 may be electrically connected to a first power supply line located in the second conductive layer. The plurality of auxiliary blocks 2330 of the auxiliary structure 233 may be electrically connected to the first power supply line through the connection line 2331 and the shield electrode 211. In this example, by electrically connecting the auxiliary structure 233 to the first power supply line, the influence on other signal lines due to a floating connection of the auxiliary structure 233 may be improved. Rest of the structure of the display substrate according to this embodiment may be referred to descriptions of the aforementioned embodiments, and will not be repeated here.

FIG. 10 is another schematic top view of a partial film layer of a display substrate according to at least one embodiment of the present disclosure. Only the first conductive layer and the transparent conductive layer are illustrated and other film layers are omitted in FIG. 10. In some examples, as shown in FIG. 10, the empty region between the edge transparent conductive lines 231*a* and 231*b* is provided with an auxiliary structure 233. The auxiliary structure 233 includes a plurality of auxiliary blocks 2330 arranged in a rectangular ring. A plurality of auxiliary blocks 2330 arranged in a direction of a width of the transparent conductive line may be connected by a connection line 2331 and there is no connection between adjacent auxiliary blocks 2330 arranged in a direction of a length of the transparent conductive line. For example, the plurality of auxiliary blocks 2330 of the auxiliary structure 233 may be divided into a plurality of groups according to the column direction, wherein each group includes a row of auxiliary blocks 2330 (e.g. including two or three auxiliary blocks), and auxiliary blocks 2330 within one group may be connected by a connection line 2331. The auxiliary blocks 2330 between adjacent groups are not electrically connected. In this example, the auxiliary blocks 2330 of each group may be electrically connected to the first power supply line or may not be electrically connected. However, this embodiment is not limited thereto. Rest of the structure of the display substrate according to this embodiment may be referred to descriptions of the aforementioned embodiments, and will not be repeated here.

Figure 11:
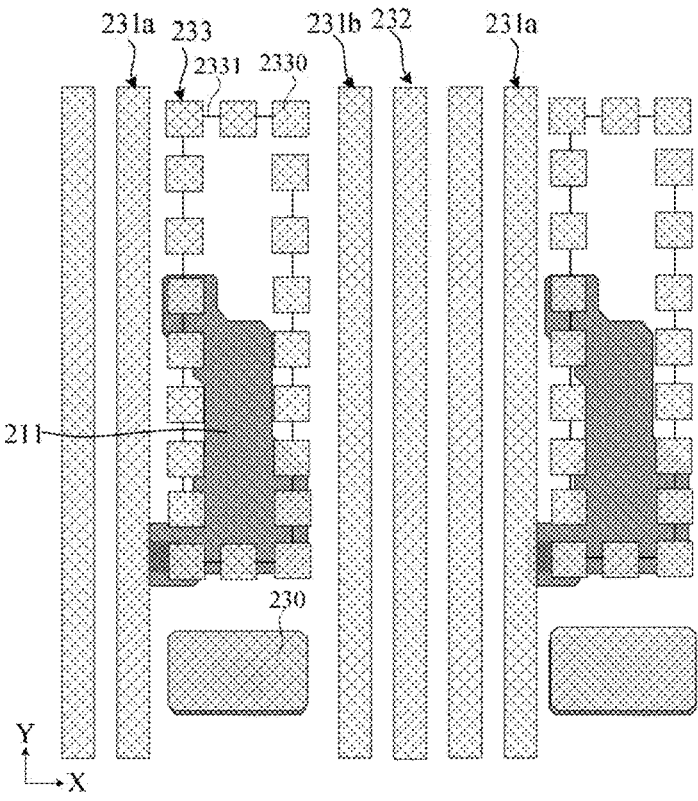
FIG. 11 is another schematic top view of a partial film layer of a display substrate according to at least one embodiment of the present disclosure.

FIG. 11 is another schematic top view of a partial film layer of a display substrate according to at least one embodiment of the present disclosure. Only the first conductive layer and the transparent conductive layer are illustrated and other film layers are omitted in FIG. 11. In some examples, as shown in FIG. 11, the empty region between the edge transparent conductive lines 231*a* and 231*b* is provided with an auxiliary structure 233. The auxiliary structure 233 may include a plurality of auxiliary blocks 2330 arranged in a rectangular ring. For example, the plurality of auxiliary blocks 2330 of the auxiliary structure 233 may be divided into two groups, wherein the first group may include a first row and a first column of auxiliary blocks 2330, the second group may include a last row and a second column of auxiliary blocks 2330, and the auxiliary blocks 2330 within each group may be electrically connected through a connection line 2331. There may be no connection between the first group and the second group. In this example, the auxiliary blocks 2330 of each group may be electrically connected to the first power supply line or may not be electrically connected. However, this embodiment is not limited thereto. Rest of the structure of the display substrate according to this embodiment may be referred to descriptions of the aforementioned embodiments, and will not be repeated here.

Figure 12:
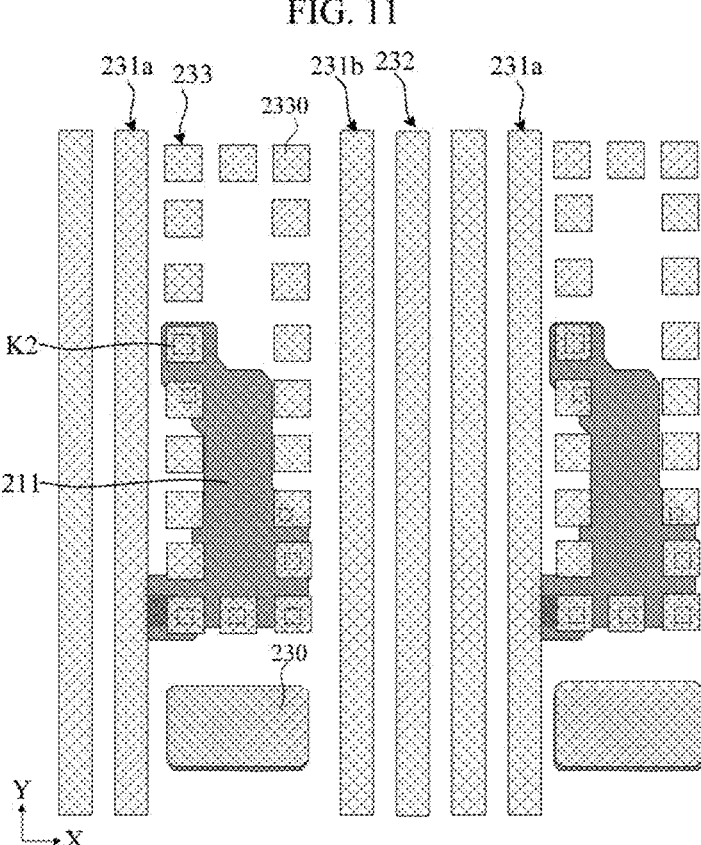
FIG. 12 is another schematic top view of a partial film layer of a display substrate according to at least one embodiment of the present disclosure.

FIG. 12 is another schematic top view of a partial film layer of a display substrate according to at least one embodiment of the present disclosure. Only the first conductive layer and the transparent conductive layer are illustrated and other film layers are omitted in FIG. 12. In some examples, as shown in FIG. 12, the empty region between the edge transparent conductive lines 231*a* and 231*b* is provided with an auxiliary structure 233. The auxiliary structure 233 includes a plurality of auxiliary blocks 2330 arranged in a rectangular ring. The plurality of (for example, six) auxiliary block 2330 having an orthographic projection on the base substrate which is overlapped with an orthographic projection of the shield electrode 211 of the first conductive layer on the base substrate may be electrically connected to the shield electrode 211 through a second via K2 opened in the first planarization layer. The shield electrode 211 may be electrically connected to a first power supply line located in the second conductive layer. A portion of the auxiliary blocks 2330 of the auxiliary structure 233 may be electrically connected to the first power supply line through the shield electrode 211 and the other portion of the auxiliary block 2330 may not be electrically connected. Rest of the structure of the display substrate according to this embodiment may be referred to descriptions of the aforementioned embodiments, and will not be repeated here.

Figures 13, 14:
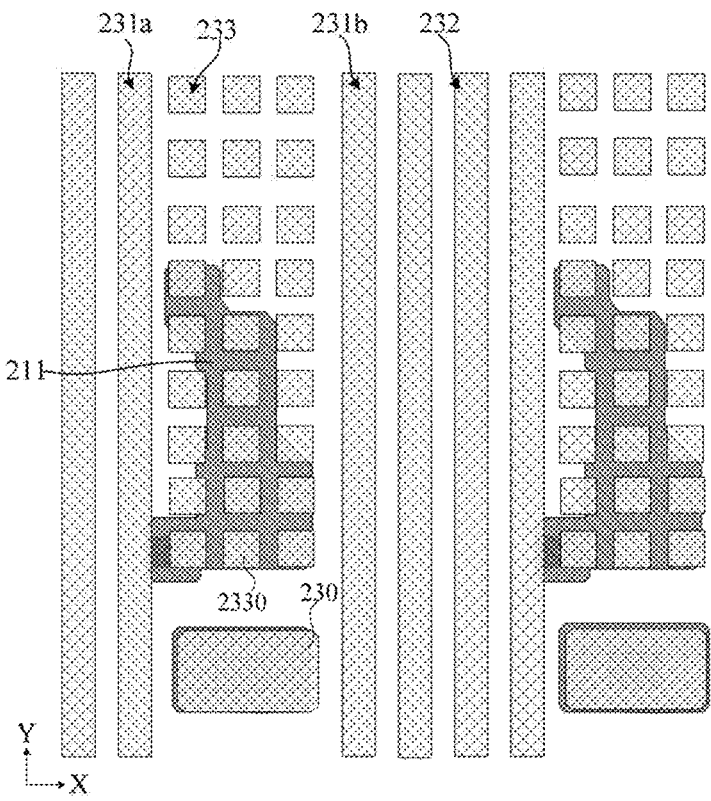
FIG. 13 is another schematic top view of a partial film layer of a display substrate according to at least one embodiment of the present disclosure.
FIG. 14 is another schematic top view of a partial film layer of a display substrate according to at least one embodiment of the present disclosure.

FIG. 13 is another schematic top view of a partial film layer of a display substrate according to at least one embodiment of the present disclosure. Only the first conductive layer and the transparent conductive layer are illustrated and other film layers are omitted in FIG. 13. In some examples, as shown in FIG. 13, the empty region between the edge transparent conductive lines 231*a* and 231*b* is provided with an auxiliary structure 233. The auxiliary structure 233 may include a plurality of auxiliary blocks 2330 arranged in an array. The auxiliary block 2330 of this example may be a Dummy structure without electrical connection. The plurality of auxiliary block 2330 may be arranged in an array along the second direction Y and the first direction X. An orthographic projection of a portion of the auxiliary blocks 2330 on the base substrate may be overlapped with an orthographic projection of the shield electrode 211 located on the first conductive layer on the base substrate, and an orthographic projection of the other portion of the auxiliary block 2330 on the base substrate may not be overlapped with an orthographic projection of the shield electrode 211 on the base substrate. Shapes and sizes of the plurality of auxiliary blocks 2330 of the auxiliary structure 233 may be substantially the same. An orthographic projection of the auxiliary blocks 2330 on the base substrate may be substantially rectangular. However, this embodiment is not limited thereto. Rest of the structure of the display substrate according to this embodiment may be referred to descriptions of the aforementioned embodiments, and will not be repeated here.

FIG. 14 is another schematic top view of a partial film layer of a display substrate according to at least one embodiment of the present disclosure. Only the first conductive layer and the transparent conductive layer are illustrated and other film layers are omitted in FIG. 14. In some examples, as shown in FIG. 14, the empty region between the edge transparent conductive lines 231*a* and 231*b* is provided with an auxiliary structure 233. The auxiliary structure 233 may include a plurality of auxiliary blocks 2330 arranged in an array. The adjacent auxiliary blocks 2330 may be connected by a connection line 2331. The plurality of auxiliary blocks 2330 of the auxiliary structure 233 is connected to form a network structure. At least one auxiliary block 2330 having an orthographic projection on the base substrate which is overlapped with an orthographic projection of the shield electrode 211 on the base substrate may be electrically connected to the shield electrode 211 through a second via K2 opened in the first planarization layer, thereby achieving an electrical connection to the first power supply line through the shield electrode 211. Rest of the structure of the display substrate according to this embodiment may be referred to descriptions of the aforementioned embodiments, and will not be repeated here.

Figure 15:
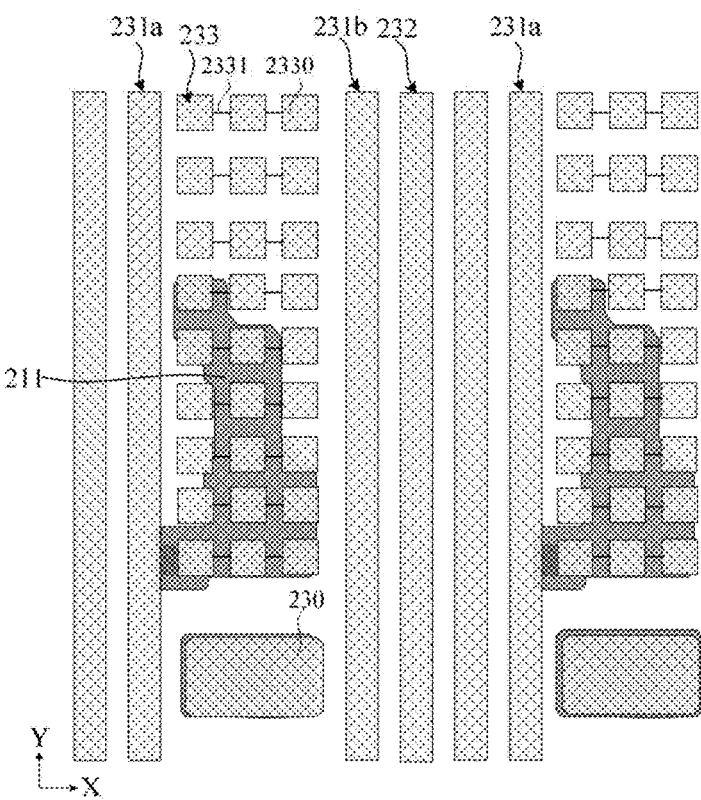
FIG. 15 is another schematic top view of a partial film layer of a display substrate according to at least one embodiment of the present disclosure.

FIG. 15 is another schematic top view of a partial film layer of a display substrate according to at least one embodiment of the present disclosure. Only the first conductive layer and the transparent conductive layer are illustrated and other film layers are omitted in FIG. 15. In some examples, as shown in FIG. 15, the empty region between the edge transparent conductive lines 231*a* and 231*b* is provided with an auxiliary structure 233. The auxiliary structure 233 may include a plurality of auxiliary blocks 2330 arranged in an array. The plurality of auxiliary blocks 2330 of the auxiliary structure 233 may be divided into a plurality of groups according to the column direction and each group may include a row of auxiliary blocks 2330. The auxiliary blocks 2330 of each group may be connected by a connection line 2331. The auxiliary blocks 2330 of adjacent groups may not be connected. At least one group of auxiliary blocks 2330 may be electrically connected to the first power supply line or a plurality of groups of auxiliary blocks may all not be electrically connected to the first power supply line. This embodiment is not limited thereto. Rest of the structure of the display substrate according to this embodiment may be referred to descriptions of the aforementioned embodiments, and will not be repeated here.

Figure 16:
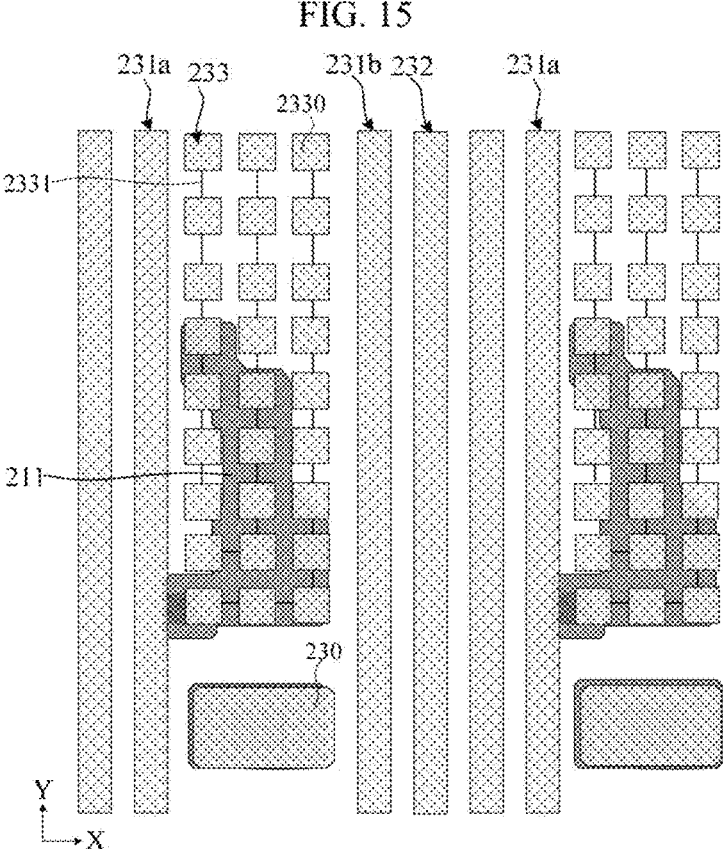
FIG. 16 is another schematic top view of a partial film layer of a display substrate according to at least one embodiment of the present disclosure.

FIG. 16 is another schematic top view of a partial film layer of a display substrate according to at least one embodiment of the present disclosure. Only the first conductive layer and the transparent conductive layer are illustrated and other film layers are omitted in FIG. 16. In some examples, as shown in FIG. 16, the empty region between the edge transparent conductive lines 231*a* and 231*b* is provided with an auxiliary structure 233. The auxiliary structure 233 may include a plurality of auxiliary blocks 2330 arranged in an array. The plurality of auxiliary blocks 2330 of the auxiliary structure 233 may be divided into three groups; the first group may include a plurality of auxiliary blocks 2330 of the first column, and exclude auxiliary blocks of the last row and the penultimate row; the second group may include a plurality of auxiliary blocks 2330 of the second column and a portion of auxiliary blocks of the penultimate row, and exclude auxiliary blocks of the third column and the last row; and the third group may include a plurality of auxiliary blocks 2330 of the third column and auxiliary blocks of the last row. The auxiliary blocks of the first group may be connected to form a strip shape, and the auxiliary blocks of the second group and the third group may be connected to form an L shape. The auxiliary blocks within each group may be connected by a connection line 2331, and the auxiliary blocks of adjacent groups may not be connected. At least one group of auxiliary blocks may be electrically connected to the first power supply line or a plurality of groups of auxiliary blocks may all not be connected to the first power supply line. This embodiment is not limited thereto. Rest of the structure of the display substrate according to this embodiment may be referred to descriptions of the aforementioned embodiments, and will not be repeated here.

Figure 17:
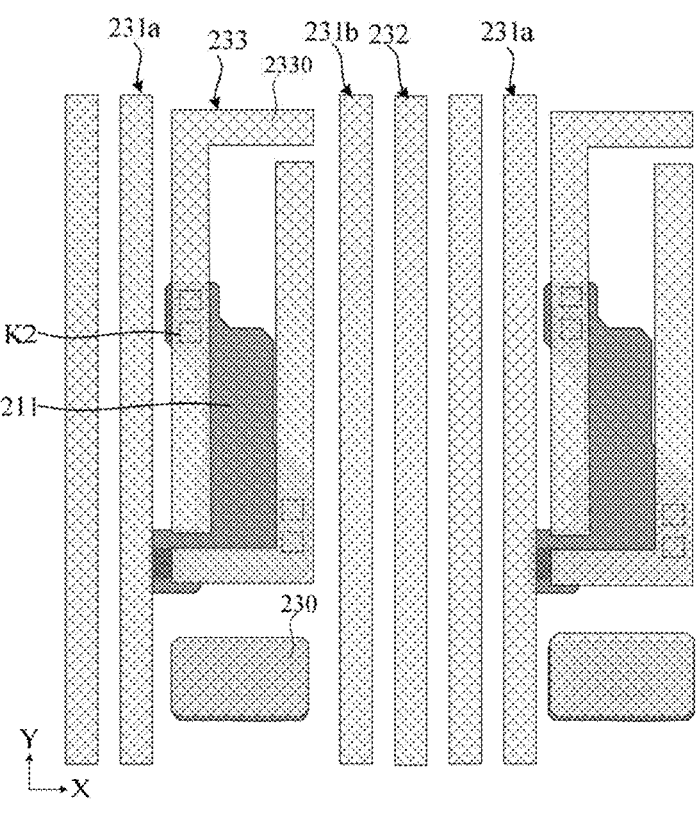
FIG. 17 is another schematic top view of a partial film layer of a display substrate according to at least one embodiment of the present disclosure.

FIG. 17 is another schematic top view of a partial film layer of a display substrate according to at least one embodiment of the present disclosure. Only the first conductive layer and the transparent conductive layer are illustrated and other film layers are omitted in FIG. 17. In some examples, as shown in FIG. 17, the empty region between the edge transparent conductive lines 231*a* and 231*b* is provided with an auxiliary structure 233. The auxiliary structure 233 may include two auxiliary blocks 2330 arranged in a ring. An orthographic projection of the auxiliary block 2330 on the base substrate may be an L type. An orthographic projection of the auxiliary block 2330 on the base substrate may be overlapped with an orthographic projection of the shield electrode 211 located in the first conductive layer on the base substrate. The auxiliary block 2330 may be electrically connected with the shield electrode 211 through at least one second via K2 opened in the first planarization layer, thereby achieving electrical connection with the first power supply line. In other examples, the auxiliary block 2330 may not be electrically connected to the first power supply line. Rest of the structure of the display substrate according to this embodiment may be referred to descriptions of the aforementioned embodiments, and will not be repeated here.

Figure 18:
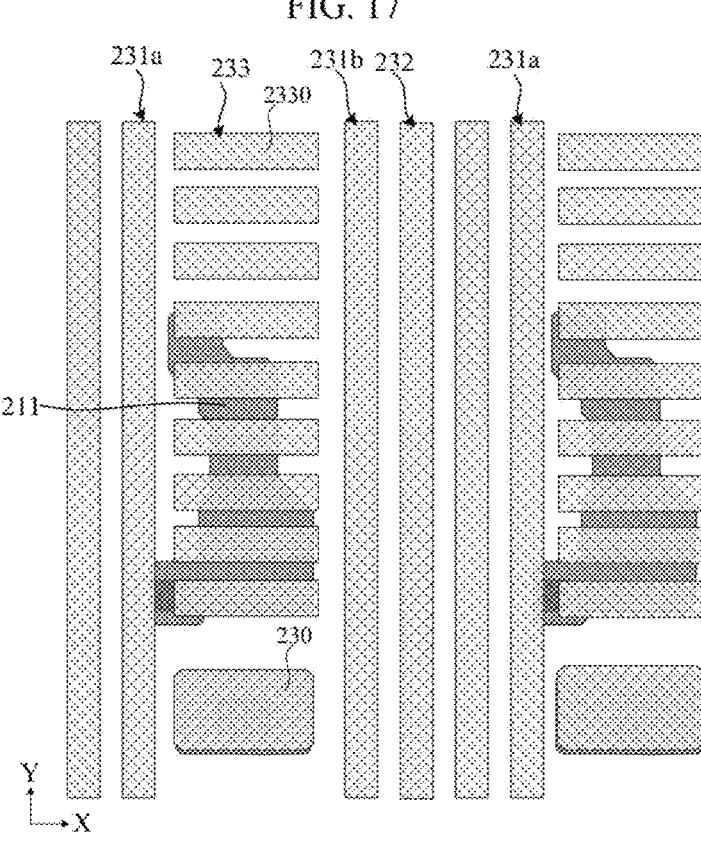
FIG. 18 is another schematic top view of a partial film layer of a display substrate according to at least one embodiment of the present disclosure.

FIG. 18 is another schematic top view of a partial film layer of a display substrate according to at least one embodiment of the present disclosure. Only the first conductive layer and the transparent conductive layer are illustrated and other film layers are omitted in FIG. 18. In some examples, as shown in FIG. 18, the empty region between the edge transparent conductive lines 231*a* and 231*b* is provided with an auxiliary structure 233. The auxiliary structure 233 may include a plurality of auxiliary blocks 2330 arranged in an array. An orthographic projection of the auxiliary block 2330 on the base substrate may be a strip shape. The auxiliary block 2330 may not be electrically connected, and may be a dummy structure; and alternatively the at least one auxiliary block 2330 may be electrically connected to the first power supply line. Rest of the structure of the display substrate according to this embodiment may be referred to descriptions of the aforementioned embodiments, and will not be repeated here.

Figure 19:
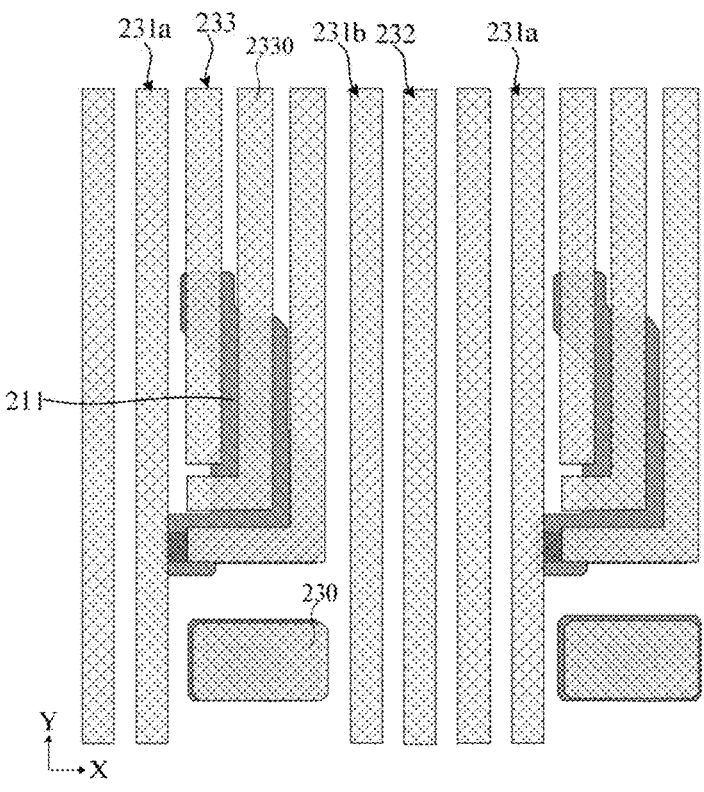
FIG. 19 is another schematic top view of a partial film layer of a display substrate according to at least one embodiment of the present disclosure.

FIG. 19 is another schematic top view of a partial film layer of a display substrate according to at least one embodiment of the present disclosure. As shown in FIG. 19, the empty region between the edge transparent conductive lines 231*a* and 231*b* is provided with an auxiliary structure 233. The auxiliary structure 233 may include a plurality of auxiliary blocks 2330 arranged regularly. An orthographic projection of the auxiliary block 2330 on the base substrate may be a strip shape or may be L-typed. The auxiliary block 2330 may not be electrically connected, and may be a dummy structure; and alternatively at least one auxiliary block 2330 may be electrically connected to the first power supply line. Rest of the structure of the display substrate according to this embodiment may be referred to descriptions of the aforementioned embodiments, and will not be repeated here.

Figure 20:
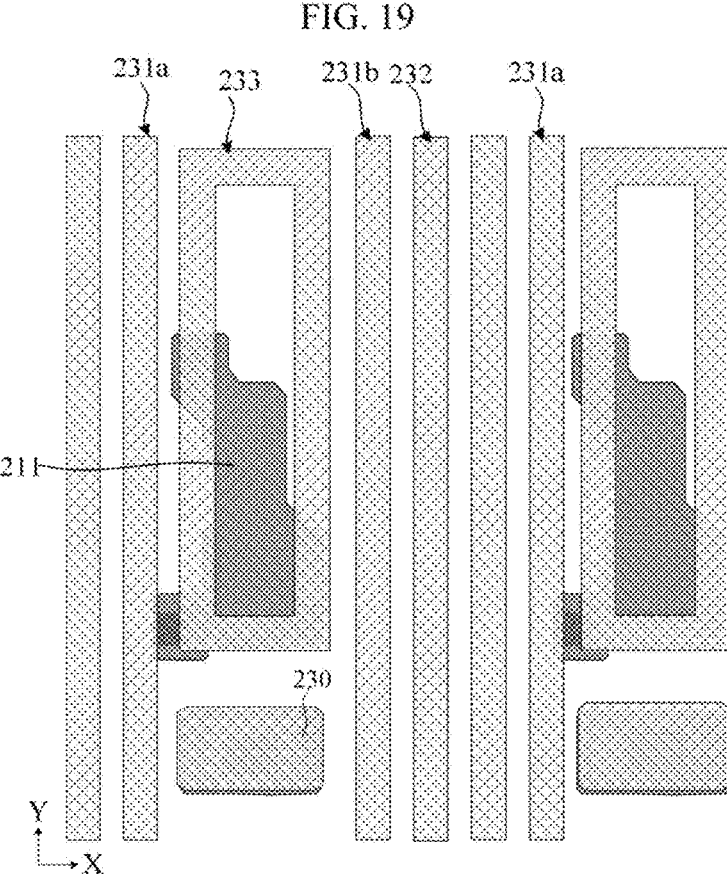
FIG. 20 is another schematic top view of a partial film layer of a display substrate according to at least one embodiment of the present disclosure.

FIG. 20 is another schematic top view of a partial film layer of a display substrate according to at least one embodiment of the present disclosure. As shown in FIG. 20, the empty region between the edge transparent conductive lines 231a and 231b is provided with an auxiliary structure 233. An orthographic projection of the auxiliary structure 233 on the base substrate may be ring-shaped, for example, rectangular ring-shaped. The auxiliary structure 233 may not be electrically connected, and may be a dummy structure; and alternatively the auxiliary structure 233 may be electrically connected to the first power supply line. However, this embodiment is not limited thereto. For example, the orthographic projection of the auxiliary structure 233 on the base substrate may be of another shape, such as a circular ring shape or an elliptical ring shape, or the like. Rest of the structure of the display substrate according to this embodiment may be referred to descriptions of the aforementioned embodiments, and will not be repeated here.

Figure 21:
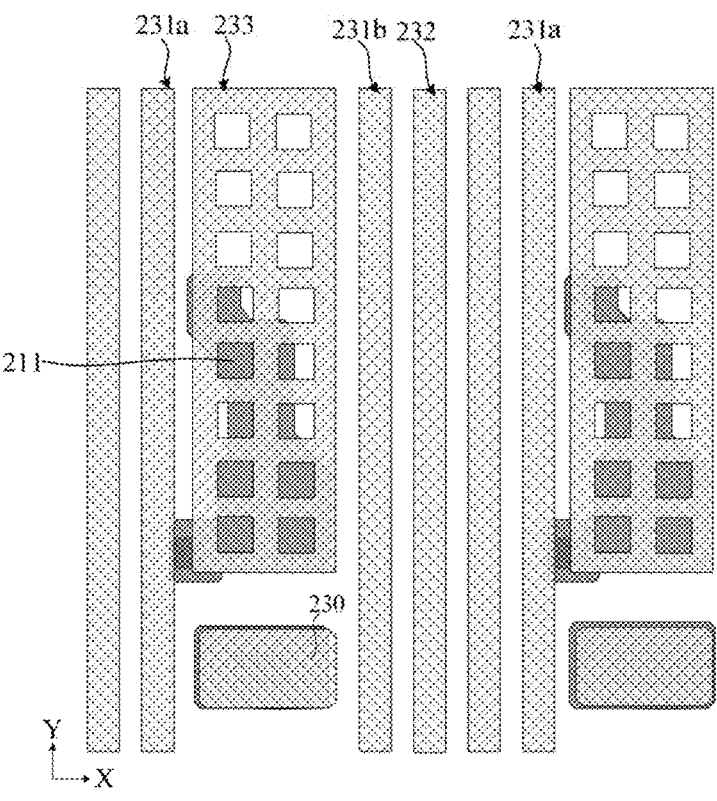
FIG. 21 is another schematic top view of a partial film layer of a display substrate according to at least one embodiment of the present disclosure.

FIG. 21 is another schematic top view of a partial film layer of a display substrate according to at least one embodiment of the present disclosure. As shown in FIG. 21, the empty region between the edge transparent conductive lines 231a and 231b is provided with an auxiliary structure 233. An orthographic projection of the auxiliary structure 233 on the base substrate may be mesh-shaped. The auxiliary structure 233 may not be electrically connected, and may be a dummy structure; and alternatively the auxiliary structure 233 may be electrically connected to the first power supply line. However, this embodiment is not limited thereto. Rest of the structure of the display substrate according to this embodiment may be referred to descriptions of the aforementioned embodiments, and will not be repeated here.

Figure 22:
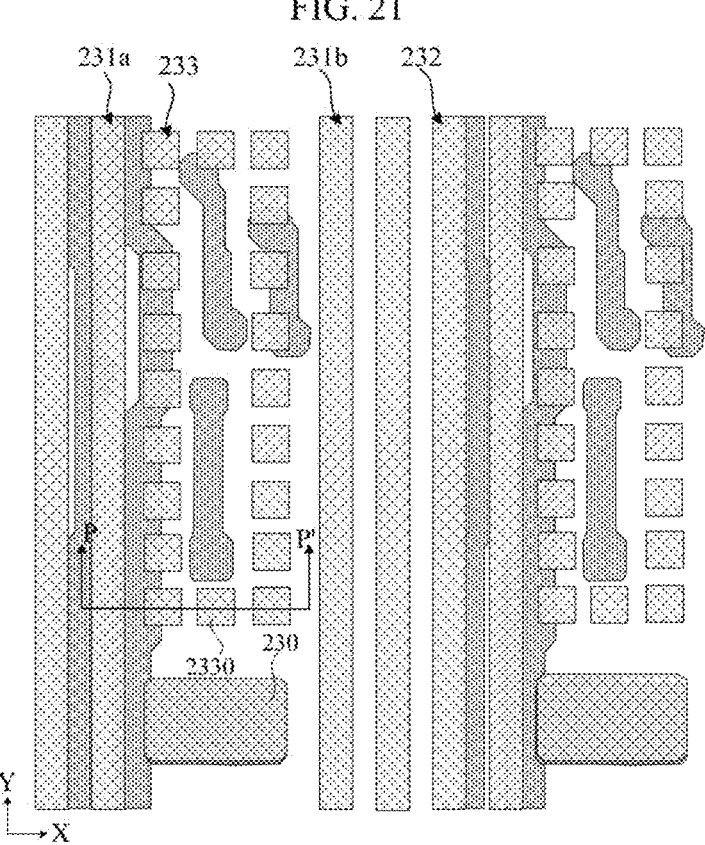
FIG. 22 is another schematic top view of a partial film layer of a display substrate according to at least one embodiment of the present disclosure.
Figure 23:
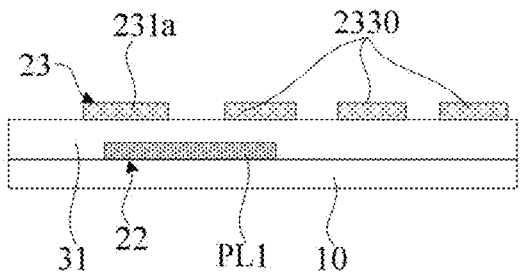
FIG. 23 is a cross-sectional view of a part taken along a direction P-P' in FIG. 22.

FIG. 22 is another schematic top view of a partial film layer of a display substrate according to at least one embodiment of the present disclosure. FIG. 23 is a cross-sectional view of a part taken along a direction P-P' in FIG. 22. In this example, it is illustrated by taking a transparent conductive layer as an example. A plurality of film layer structures on a side of the second conductive layer close to the display substrate and a plurality of film layers on a side of the transparent conductive layer away from the base substrate are omitted in FIG. 22 and FIG. 23.

In some exemplary implementation, as shown in FIG. 22 and FIG. 23, in a direction perpendicular to a display substrate, a display substrate of the first display region A1 may include: a base substrate 10, and a pixel circuit layer (for example, including a second conductive layer 22), a first planarization layer 31, and a transparent conductive layer 23 that are arranged on the base substrate 10. The transparent conductive layer 23 may include an auxiliary structure 233 located in an empty region between the edge transparent conductive lines 231a and 231b. An orthographic projection of the auxiliary structure 233 on the base substrate may be overlapped with an orthographic projection of the pixel circuit of the pixel circuit layer on the base substrate. The display substrate of this example may be a structure of a single source-drain metal layer, and the display substrate of the foregoing embodiment may be a structure of a dual source-drain metal layer. Rest of the structure of the display substrate according to this embodiment may be referred to descriptions of the aforementioned embodiments, and will not be repeated here.

The display substrate provided by the embodiment, by arranging the auxiliary structure arranged within the empty region outside the first transparent conductive line, the exposure environment of the exposure process for preparing the transparent conductive layer can be improved (e.g., the reflection of light in the first via is reduced, and the exposure amount received by the first transparent conductive line is reduced), thereby affecting the line width of the edge transparent conductive line, and further improving the disconnection or the thinning of the first transparent conductive line due to the reflection and focusing effect of the first conductive layer in the exposure process.

In other examples, the auxiliary structure arranged in the empty region outside the first transparent conductive line may include a plurality of auxiliary blocks, and the plurality of auxiliary blocks may be arranged in a pattern of B-type, D-type, S-type, H-type, L-type, N-type, M-type, etc. An orthographic projection of at least a portion of the plurality of auxiliary blocks on the base substrate may be overlapped with an orthographic projection of the shield electrode on the base substrate.

In other examples, shapes of the plurality of auxiliary structures arranged within one transparent conductive layer may be substantially the same or may be partially the same. For example, the plurality of auxiliary structures included in one transparent conductive layer may all be the auxiliary structure shown in FIG. 4, or may include the auxiliary structure shown in FIG. 4 and the auxiliary structure shown in FIG. 13. However, this embodiment is not limited thereto.

A film layer structure of a pixel circuit layer of the display substrate will be illustrated below with an example.

Figure 24:
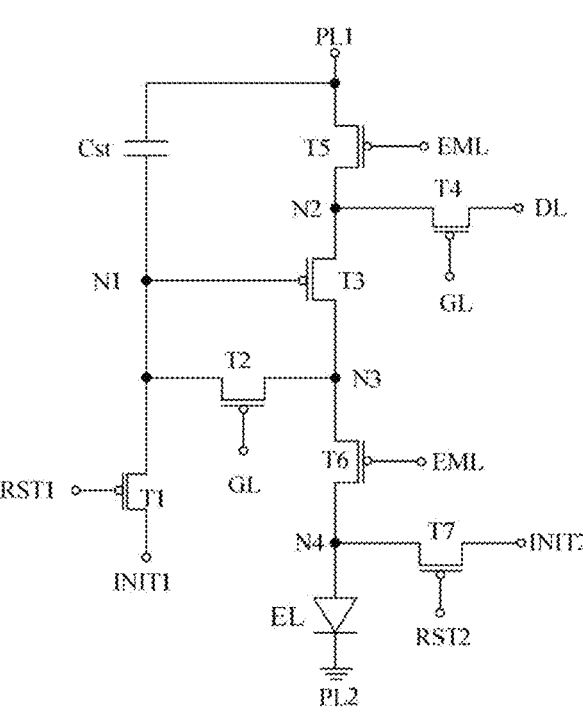
FIG. 24 is an equivalent circuit diagram of a pixel circuit according to at least one embodiment of the present disclosure.
Figure 25:
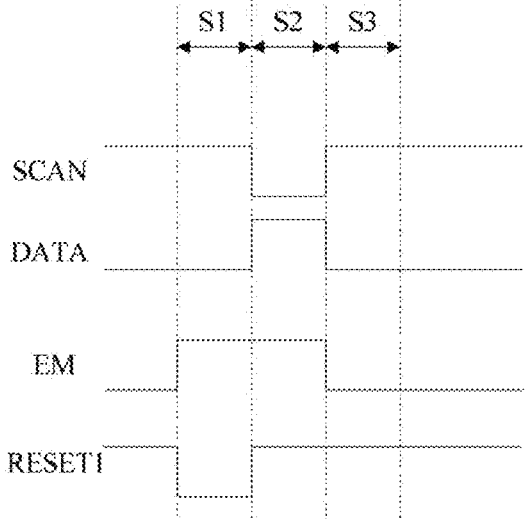
FIG. 25 is a working sequence diagram of a pixel circuit according to at least one embodiment of the present disclosure.

FIG. 24 is an equivalent circuit diagram of a pixel circuit according to at least one embodiment of the present disclosure. FIG. 25 is a working sequence diagram of a pixel circuit according to at least one embodiment of the present disclosure. The pixel circuit of the present exemplary embodiment is a 7T1C structure. However, this embodiment is not limited thereto. For example, the pixel circuit may be a structure of 3T1C, 5T1C, 8T1C, or 8T2C, etc.

In some exemplary implementations, as shown in FIG. 24, the pixel circuit of this example includes six switching transistors (T1, T2, and T4 to T7), a drive transistor T3, and a storage capacitor Cst. The six switching transistors are respectively a data writing transistor T4, a threshold compensation transistor T2, a first light-emitting control transistor T5, a second light-emitting control transistor T6, a first reset transistor T1, and a second reset transistor T7. The light-emitting element EL includes an anode, a cathode and an organic light-emitting layer arranged between the anode and the cathode.

In some exemplary implementation, the drive transistor and the six switching transistors may be P-type transistors or may be N-type transistors. Using a same type of transistors in a pixel circuit may simplify a process flow, reduce a process difficulty of a display substrate, and improve a yield of products. In some exemplary implementation, the drive transistor and the six switching transistors may include a P-type transistor and an N-type transistor.

In some exemplary implementation, Low Temperature Poly-Silicon thin film transistors, or oxide thin film transistors, or a Low Temperature Poly-Silicon thin film transistor and an oxide thin film transistor may be used for the drive transistor and the six switching transistors. An active layer of a Low Temperature Poly-Silicon thin film transistor is made of Low Temperature Poly-Silicon (LTPS), and an active layer of an oxide thin film transistor is made of an oxide semiconductor (Oxide). A Low-temperature Poly-Silicon thin film transistor has advantages such as a high mobility and fast charging, while an oxide thin film transistor has an advantage such as a low leakage current. The Low Temperature Poly-Silicon thin film transistor and the oxide thin film transistor are integrated on one display substrate to form a Low Temperature Polycrystalline Oxide (LTPO) display substrate, and advantages of both the Low Temperature Poly-Silicon thin film transistor and the oxide thin film transistor may be utilized to achieve low frequency drive, reduce power consumption, and improve display quality.

In some exemplary implementations, as shown in FIG. 24, a display substrate includes a scan line GL, a data line DL, a first power supply line PL1, a second power supply line PL2, an emitting control line EML, a first initial signal line INIT1, a second initial signal line INIT2, a first reset control line RST1, and a second reset control line RST2. In some examples, the first power supply line PL1 is configured to provide a constant first voltage signal VDD to a pixel circuit, the second power supply line PL2 is configured to provide a constant second voltage signal VSS to a pixel circuit, and the first voltage signal VDD is greater than the second voltage signal VSS. The scan line GL is configured to provide a scan signal SCAN to the pixel circuit, the data line DL is configured to provide a data signal DATA to the pixel circuit, the light-emitting control line EML is configured to provide a light-emitting control signal EM to the pixel circuit, the first reset control line RST1 is configured to provide a first reset control signal RESET1 to the pixel circuit, and the second reset control line RST2 is configured to provide a second reset control signal RESET2 to the pixel circuit. In some examples, in pixel circuits of an n-th row, a first reset control line RST1 may be electrically connected with a scan line GL of the pixel circuits of an (n−1)-th row to be inputted with a scan signal SCAN (n−1), that is, a first reset control signal RESET1 (n) is the same as the scan signal SCAN (n−1). A second reset control line RST2 may be electrically connected with a scan line GL of pixel circuits of an n-th row to be inputted with a scan signal SCAN (n), that is, a second reset control signal RESET2 (n) is the same as the scan signal SCAN (n). In some examples, a second reset control line RST2 with which the pixel circuits of the n-th row is electrically connected and a first reset control line RST1 with which the pixel circuits of the (n+1)-th row is electrically connected are of an integral structure. Thus, signal lines of the display substrate may be reduced, and a narrow bezel of the display substrate may be achieved. However, this embodiment is not limited thereto.

In some exemplary implementations, the first initial signal line INIT1 is configured to provide a first initial signal to the pixel circuit, the second initial signal line INIT2 is configured to provide a second initial signal to the pixel circuit. For example, the first initial signal and the second initial signal may be constant voltage signals, and their magnitudes may be between a first voltage signal VDD and a second voltage signal VSS, but not limited to this.

In some exemplary implementation, as shown in FIG. 24, a drive transistor T3 is electrically connected with a light-emitting element EL, and outputs a drive current to drive the light-emitting element EL to emit light under control of a scan signal SCAN, a data signal DATA, a first voltage signal VDD, a second voltage signal VSS and etc. A gate of a data writing transistor T4 is electrically connected with a scan line GL, a first electrode of the data writing transistor T4 is electrically connected with a data line DL, and a second electrode of the data writing transistor T4 is electrically connected with a first electrode of the drive transistor T3. A gate of a threshold compensation transistor T2 is electrically connected with a scan line GL, a first electrode of the threshold compensation transistor T2 is electrically connected with a gate of the drive transistor T3, and a second electrode of the threshold compensation transistor T2 is electrically connected with a second electrode of the drive transistor T3. A gate of a first light-emitting control transistor T5 is electrically connected with a light-emitting control line EML, a first electrode of the first light-emitting control transistor T5 is electrically connected with a first power supply line PL1, and a second electrode of the first light-emitting control transistor T5 is electrically connected with the first electrode of the drive transistor T3. A gate of a second light-emitting control transistor T6 is electrically connected with the light-emitting control line EML, a first electrode of the second light-emitting control transistor T6 is electrically connected with the second electrode of the drive transistor T3, and a second electrode of the second light-emitting control transistor T6 is electrically connected with an anode of the light-emitting element EL. A first reset transistor T1 is electrically connected with the gate of the drive transistor T3 and configured to reset the gate of the drive transistor T3, and a second reset transistor T7 is electrically connected with the anode of the light-emitting element EL and configured to reset the anode of the light-emitting element EL. A gate of the first reset transistor T1 is electrically connected with a first reset control line RST1, a first electrode of the first reset transistor T1 is electrically connected with a first initial signal line INIT1, and a second electrode of the first reset transistor T1 is electrically connected with the gate of the drive transistor T3. A gate of the second reset transistor T7 is electrically connected with a second reset control line RST2, a first electrode of the second reset transistor T7 is electrically connected with a second initial signal line INIT2, and a second electrode of the second reset transistor T7 is electrically connected with the anode of the light-emitting element EL. A first electrode of a storage capacitor Cst is electrically connected with the gate of the drive transistor T3, and a second electrode of the storage capacitor Cst is electrically connected with the first power supply line PL1.

In this example, a first node N1 is a connection point of the storage capacitor Cst, the first reset transistor T1, the drive transistor T3, and the threshold compensation transistor T2, a second node N2 is a connection point of the first light-emitting control transistor T5, the data writing transistor T4, and the drive transistor T3, a third node N3 is a connection point of the drive transistor T3, the threshold compensation transistor T2, and the second light-emitting control transistor T6, and a fourth node N4 is a connection point of the second light-emitting control transistor T6, the second reset transistor T7, and the light-emitting element EL.

A working process of the pixel circuit illustrated in FIG. 24 will be described below with reference to FIG. 25. The description is given by taking a case in which a plurality of transistors included in the pixel circuit shown in FIG. 24 are all P-type transistors as an example.

In some exemplary implementations, as shown in FIG. 25, during one frame display period, a working process of a pixel circuit of a first structure includes: a first stage S1, a second stage S2, and a third stage S3.

The first stage S1 is referred to as a reset stage. A first reset control signal RESET1 provided by the first reset control line RST1 is a low-level signal, so that the first reset transistor T1 is turned on, and a first initial signal provided by the first initial signal line INIT1 is provided to the first node N1 to initialize the first node N1 and clear an original data voltage in the storage capacitor Cst. A scan signal SCAN provided by the scan line GL is a high-level signal, and a light-emitting control signal EM provided by the light-emitting control line EML is a high-level signal, so that the data writing transistor T4, the threshold compensation transistor T2, the first light-emitting control transistor T5, the second light-emitting control transistor T6, and the second reset transistor T7 are turned off. In this stage, the light-emitting element EL does not emit light.

The second stage S2 is referred to as a data writing stage or a threshold compensation stage. A scan signal SCAN provided by the scan line GL is a low-level signal, a first reset control signal RESET1 provided by the first reset control line RST1 and an emitting control signal EM provided by the emitting control line EML are both high-level signals, and the data line DL outputs a data signal DATA. In this stage, the second electrode of the storage capacitor Cst is at a low level, so that the drive transistor T3 is turned on. The scan signal SCAN is a low-level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N1 through the second node N2, the turned-on drive transistor T3, the third node N3, and the turned-on threshold compensation transistor T2, and the storage capacitor Cst is charged with a difference between the data voltage Vdata output by the data line DL and a threshold voltage of the drive transistor T3. A voltage of a first electrode (that is, the first node N1) of the storage capacitor Cst is Vdata–|Vth|, wherein Vdata is the data voltage output by the data line DL, and Vth is the threshold voltage of the drive transistor T3. The second reset transistor T7 is turned on, so that a second initial signal provided by the second initial signal line INIT2 is provided to the anode of the light-emitting element EL to initialize (reset) the anode of the light-emitting element EL and clear a pre-stored voltage therein, so as to complete initialization, thereby ensuring that the light-emitting element EL does not emit light. The first reset control signal RESET1 provided by the first reset control line RST1 is a high-level signal, so that the first reset transistor T1 is turned off. The light-emitting control signal EM provided by the light-emitting control signal line EML is a high-level signal, so that the first light-emitting control transistor T5 and the second light-emitting control transistor T6 are turned off.

The third stage S3 is referred to as a light-emitting stage. A light-emitting control signal EM provided by the light-emitting control signal line EML is a low-level signal, and a scan signal SCAN provided by the scan line GL and a first reset control signal RESET1 provided by the first reset control line RST1 are high-level signals. The light-emitting control signal EM provided by the light-emitting control signal line EML is a low-level signal, so that the first light-emitting control transistor T5 and the second light-emitting control transistor T6 are turned on, and a first voltage signal VDD output by the first power supply line PL1 provides a drive voltage to an anode of the light-emitting element EL through the turned-on first light-emitting control transistor T5, the drive transistor T3, and the second light-emitting control transistor T6 to drive the light-emitting element EL to emit light.

In a drive process of the pixel circuit, a drive current flowing through the drive transistor T3 is determined by a voltage difference between the gate and the first electrode of the drive transistor T3. Because the voltage of the first node N1 is Vdata–|Vth|, the drive current of the drive transistor T3 is as follows.

$$I = K \times (Vgs - Vth)^2 =$$
$$K \times [(VDD - Vdata + |Vth|) - Vth]^2 = K \times [VDD - Vdata]^2.$$

Among them, I is the drive current flowing through the drive transistor T3, that is, the drive current for driving the light-emitting element EL; K is a constant; Vgs is the voltage difference between the gate and the first electrode of the drive transistor T3; Vth is the threshold voltage of the drive transistor T3; Vdata is the data voltage output by the data line DL; and VDD is the first voltage signal output by the first power supply line PL1.

It may be seen from the above formula that a current flowing through the light-emitting element EL has nothing to do with the threshold voltage of the drive transistor T3. Therefore, the pixel circuit of this embodiment may better compensate the threshold voltage of the drive transistor T3.

Figures 26, 27:
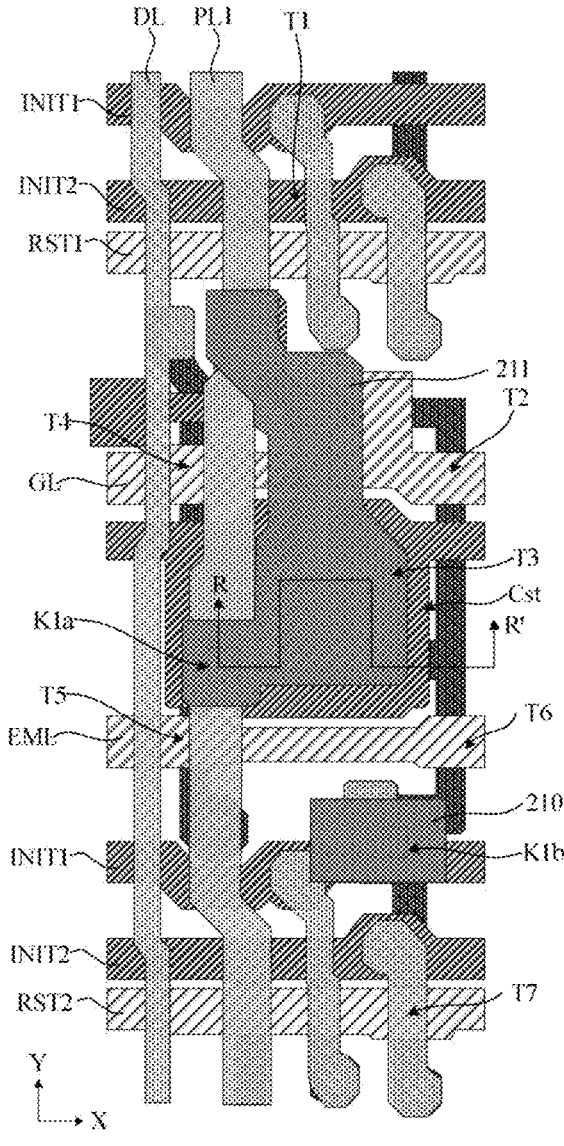
FIG. 26 is a schematic top view of a pixel circuit according to at least one embodiment of the present disclosure.
FIG. 27 is a partial sectional view along an R-R' direction in FIG. 26.

FIG. 26 is a schematic top view of a pixel circuit according to at least one embodiment of the present disclosure. FIG. 27 is a partial sectional view along an R-R' direction in FIG. 26. In some exemplary implementations, as shown in FIG. 26 and FIG. 27, the pixel circuit layer of the display substrate in the first display region may include a semiconductor layer 110, a first insulation layer 101, a first gate metal layer 111, a second insulation layer 102, a second gate metal layer 112, a third insulation layer 103 and a second conductive layer 22 which are arranged on the base substrate 10 sequentially. A second planarization layer 32 and a first conductive layer 21 are sequentially arranged on a side of the second conductive layer 22 away from the base substrate 10. In some examples, the first insulation layer 101, the second insulation layer 102 and the third insulation layer 103 may be inorganic insulation layers. However, this embodiment is not limited thereto.

Figures 28A, 28B:
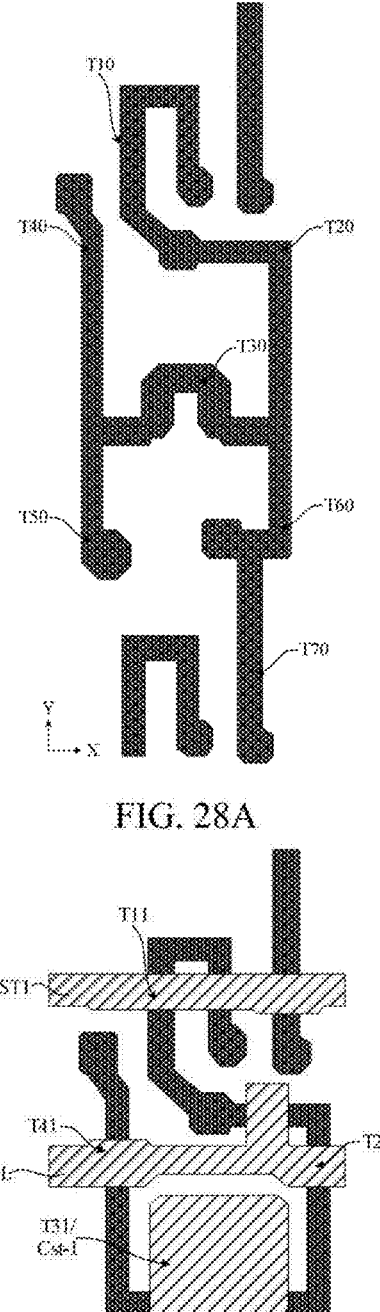
FIG. 28A is a schematic top view of a display substrate after a semiconductor layer is formed in FIG. 26.
FIG. 28B is a schematic top view of a display substrate after a first gate metal layer is formed in FIG. 26.
Figure 28C:
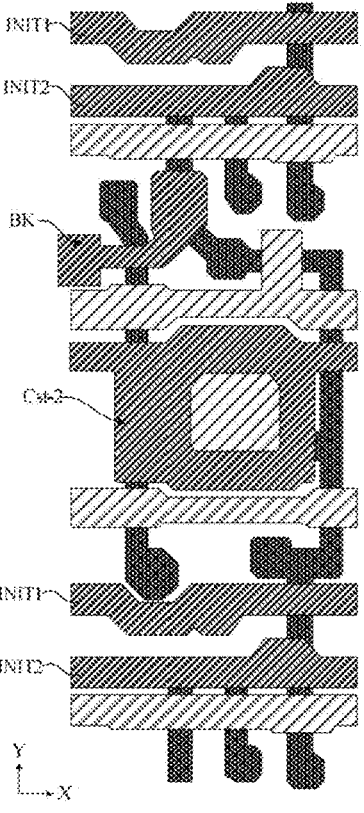
FIG. 28C is a schematic top view of a display substrate after a second gate metal layer is formed in FIG. 26.
Figure 28D:
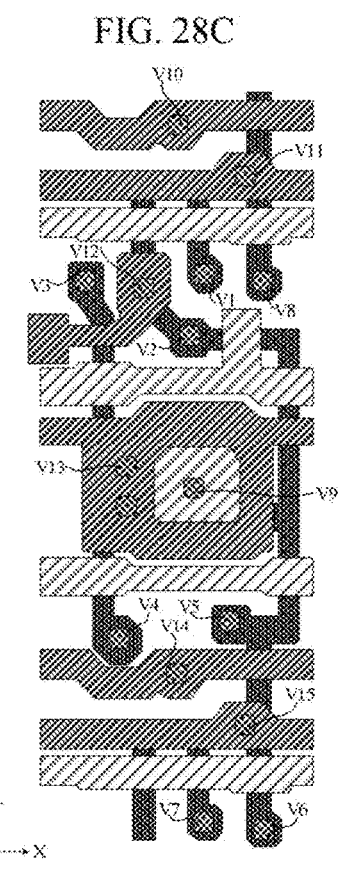
FIG. 28D is a schematic top view of a display substrate after a third insulation layer is formed in FIG. 26.
Figure 28E:
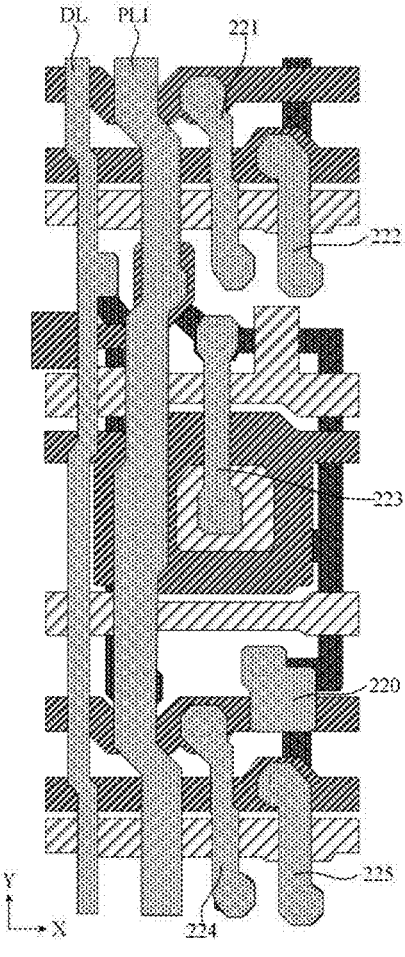
FIG. 28E is a schematic top view of a display substrate after a second conductive layer is formed in FIG. 26.

FIG. 28A is a schematic top view of a display substrate after a semiconductor layer is formed in FIG. 26. FIG. 28B is a schematic top view of a display substrate after a first gate metal layer is formed in FIG. 26. FIG. 28C is a schematic top view of a display substrate after a second gate metal layer is formed in FIG. 26. FIG. 28D is a schematic top view of a display substrate after a third insulation layer is formed in FIG. 26. FIG. 28E is a schematic top view of a display substrate after a second conductive layer is formed in FIG. 26.

The structure of the display substrate will be described below through an example of a manufacturing process of the display substrate. The "patterning process" mentioned in the embodiments of the present disclosure includes processes, such as photoresist coating, mask exposure, development, etching and photoresist stripping for metal materials, inorganic materials or transparent conductive materials, and includes organic material coating, mask exposure and development for organic materials. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film formed by a material on a base substrate through deposition, coating, or other processes. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern".

In some exemplary implementation, a preparation process of a display substrate may include following operations.

(1) A base substrate is provided.

In some exemplary implementation, the base substrate 10 may be a rigid substrate, e.g., a glass substrate. However, this embodiment is not limited thereto. For example, the base substrate 10 may be a flexible substrate.

(2) Forming a semiconductor layer.

In some exemplary implementations, a semiconductor thin film is deposited on the base substrate 10 in the first display region, and the semiconductor thin film is patterned by a patterning process to form a semiconductor layer 110. As shown in FIG. 27 and FIG. 28, the semiconductor layer 110 may include: active layers of a plurality of transistors of a pixel circuit, e.g., an active layer T10 of a first reset transistor T1, an active layer T20 of a threshold compensation transistor T2, an active layer T30 of a drive transistor T3, an active layer T40 of a data writing transistor T4, an active layer T50 of a first light-emitting control transistor T5, an active layer T60 of a second light-emitting control transistor T6, and an active layer T70 of a second reset transistor T7. The active layers of the seven transistors of one pixel circuit may be of an integral structure in which the active layers are connected with each other.

In some exemplary implementation, a material of the semiconductor layer 110 may include, for example, polysilicon. An active layer may include at least one channel region and a plurality of doped regions. The channel region may not be doped with an impurity, and has characteristics of a semiconductor. The plurality of doped regions may be on two sides of the channel region and doped with impurities, and thus have conductivity. The impurities may be changed according to a type of a transistor. In some examples, a doped region of the active layer may be interpreted as a source or a drain of a transistor. A part of the active layer between the transistors may be interpreted as a wiring doped with an impurity, and may be used for electrically connecting the transistors.

(3) A first gate metal layer is formed.

In some exemplary implementation, a first insulation thin film and a first metal thin film are sequentially deposited on the base substrate 10 where the aforementioned structure is formed, and the first metal thin film is patterned through a patterning process to form a first insulation layer 101 covering the semiconductor layer 110, and the first gate metal layer 111 arranged on the first insulation layer 101 in the first display region. As shown in FIG. 27 and FIG. 28B, the first gate metal layer 111 may include gates of a plurality of transistors of the pixel circuit, and a first electrode plate Cst-1 of the storage capacitor Cst, a first reset control line RST1, a second reset control line RST2, a scan line GL, and a light-emitting control line EML. The first reset control line RST1 and a gate T11 of a first reset transistor T1 may be of an integral structure. The scan line GL, a gate T41 of a data writing transistor T4, and a gate T21 of a threshold compensation transistor T2 may be of an integral structure. A gate electrode T31 of the drive transistor T3 and a first electrode plate Cst-1 of the storage capacitor Cst may be of an integrated structure. The emitting control line EML, a gate T51 of a first emitting control transistor T5, and a gate T61 of a second emitting control transistor T61 may be of an integral structure. The second reset control line RST2 and a gate T71 of a second reset transistor T7 may be of an integral structure.

(4) A second gate metal layer is formed.

In some exemplary implementation, a second insulation thin film and a second metal thin film are sequentially deposited on the base substrate 10 where the aforementioned structure is formed, and the second metal thin film is patterned through a patterning process to form a second insulation layer 102 covering the first gate metal layer 111, and the second gate metal layer 112 arranged on the second insulation layer 102 in the first display region. As shown in FIG. 27 and FIG. 28C, the second gate metal layer 112 may include a second plate Cst-2 of the storage capacitor Cst of a pixel circuit, a shielding electrode BK, a first initial signal line INIT1, and a second initial signal line INIT2. The shielding electrode BK is configured to shield an influence of a data voltage jump on a key node, avoid an influence of the data voltage jump on a potential of the key node of a pixel circuit, and improve a display effect.

(5) Forming a third insulation layer and a second conductive layer.

In some exemplary implementations, a third insulation thin film is deposited on the base substrate 10 on which the aforementioned structures are formed to form a third insulation layer 103 through a patterning process. The third insulation layer 103 is provided with a plurality of pixel vias. Subsequently, a third metal thin film is deposited, and is patterned through a patterning process to form a second conductive layer 22 arranged on the third insulation layer 103 in the first display region.

As shown in FIG. 7 and FIG. 28D, the third insulation layer 103 is provided with a plurality of pixel vias, for example, including a first pixel via V1 to a fifteenth pixel via V15. The third insulation layers 103, the second insulation layers 102 and the first insulation layers 101 within the first pixel via V1 to the eighth pixel via V8 are removed to expose a surface of the semiconductor layer 110. The third insulation layer 103 and the second insulation layer 102 within the ninth via V9 are removed to expose a surface of the first gate metal layer 111. The third insulation layers 103 within the tenth via V10 to the fifteenth via V15 are removed to expose the surface of the second gate metal layer 112.

As shown in FIG. 27 and FIG. 28E, the second conductive layer 22 may include a data line DL, a first power supply line PL1, and a plurality of connection electrodes (for example, a first anode connection electrode 220, a first connection electrode 221 to a fifth connection electrode 225). The first anode connection electrode 220 may be electrically connected with a second doped region of an active layer T60 of the second light-emitting control transistor T6 through a fifth pixel via V5. The first connection electrode 221 may be electrically connected with a first doped region of an active layer T10 of the first reset transistor T1 through a first pixel via V1, and may be electrically connected with a first initial signal line INIT1 through a tenth pixel via V10. The second connection electrode 222 may be electrically connected with a first doped region of the active layer of the second reset transistor of the front row of pixel circuit through a eighth pixel via V18, and may be electrically connected with a second initial signal line INIT2 through an eleventh pixel via V11. The third connection electrode 223 may be electrically connected with a gate T31 of the drive transistor T3 through a ninth pixel via V9, and may be electrically connected with a first doped region of the active layer T20 of the threshold compensation transistor T2 through a second pixel via V2. The fourth connection electrode 224 may be electrically connected with a first doped region of the active layer of the first reset transistor of the next row of the pixel circuit through a seventh pixel via V7, and may be electrically connected with another first initial signal line INIT1 through a fourteenth via V14. The fifth connection electrode 225 may be electrically connected with a first doped region of the active layer T70 of the second reset transistor T7 through a sixth pixel via V6, and may be electrically connected with another second initial signal line INIT2 through a fifteenth pixel via V15. The data line DL may be electrically connected with a first doped region of the active layer T40 of the data writing transistor T4 through the third pixel via V3. The first power supply line PL1 may be electrically connected to a shielding electrode BK through a twelfth pixel via V12, may be electrically connected to a first doped region of the active layer T50 of the first light-emitting control transistor T5 through the fourth pixel via V4, and may be electrically connected to a second electrode plate Cst-2 of the storage capacitor Cst through two thirteenth pixel vias V13 arranged in a vertical row.

So far, preparation for the pixel circuit layer of the first display region A1 is completed. A second display region A2 may include the base substrate 10, the first insulation layer 101, the second insulation layer 102 and the third insulation layer 103 that are stacked on the base substrate 10.

(6) A second planarization layer and a first conductive layer are formed.

In some exemplary implementation, a first planarization thin film is coated on the base substrate 10 on which the aforementioned structures are formed, and the second planarization layer 32 is formed through a patterning process. Subsequently, a fourth metal thin film is deposited, and the fourth metal thin film is patterned through a patterning process to form a first conductive layer 21 arranged on the second planarization layer 32 in the first display region. As shown in FIG. 26 and FIG. 27, the second planarization layer 32 can be provided with a plurality of vias (e.g. first vias K1a and K1b). The second planarization layer 32 within the first vias K1a and K1b is removed to expose a surface of the second conductive layer 22. The first conductive layer 21 may include a shield electrode 211 and a second anode connection electrode 210. The shield electrode 211 may be electrically connected to a first power supply line PL1 through the first via K1a. The second anode connection electrode 210 may be electrically connected with the first anode connection electrode 220 through the first via K1a. In this example, the shield electrode 211 may be in an irregular shape to be configured to cover the first node N1 to reduce crosstalk of the transparent conductive layer to the first node N1. However, this embodiment is not limited thereto. In other examples, the shield electrode 211 may be a regular shape of a circle, or a pentagon, or a hexagon, etc.

(7) A first planarization layer and a transparent conductive layer are formed.

In some exemplary implementation, a second planarization thin film is coated on the base substrate 10 on which the aforementioned structures are formed, and the first planarization layer 31 is formed through a patterning process. Subsequently, a conductive thin film is deposited and is patterned through a patterning process to form a transparent conductive layer arranged on the first planarization layer 31, as shown in FIG. 4 and FIG. 5.

In some examples, a third planarization thin film is coated on the base substrate on which the aforementioned structures are formed, and the third planarization layer is formed through a patterning process. Subsequently, an anode conductive thin film is deposited through a patterning process to form an anode layer arranged on third planarization layer. Subsequently, a pixel define thin film is coated on the base substrate where the aforementioned patterns are formed, and a Pixel Define Layer (PDL) is formed by masking, exposure and development processes. The pixel define layer is formed with a plurality of pixel openings exposing the anode layer. An organic emitting layer is formed in the aforementioned pixel openings, and the organic emitting layer is connected with an anode. Subsequently, a cathode thin film is deposited and patterned by a patterning process to form a pattern of a cathode. The cathode is electrically connected with the organic emitting layer and the second power supply line respectively. Then, an encapsulation layer is formed on the cathode. The encapsulation layer may include a stacked structure of an inorganic material/an organic material/an inorganic material.

In some exemplary implementations, the first gate metal layer, the second gate metal layer, a first conductive layer and a second conductive layer may be made of a metal material, such as any one or more of argentum (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multilayer composite structure, such as Mo/Cu/Mo. The transparent conductive layer may be made of a transparent conductive material, such as Indium Tin Oxide (ITO). The first insulation layer, the second insulation layer, and the third insulation layer may be made of any one or more of Silicon Oxide (SiOx), Silicon Nitride (SiNx), and Silicon Oxynitride (SiON), and may be in a single layer, a multilayer, or a composite layer. The first planarization layer to the fifth planarization layer may be made of an organic material, such as polyimide, acrylic, or polyethylene terephthalate. The pixel define layer may be made of an organic material, such as polyimide, acrylic, or polyethylene terephthalate. The anode layer may be made of a reflective material such as a metal, and the cathode may be made of a transparent conductive material. However, this embodiment is not limited thereto.

A structure and the preparation process of the display substrate of this embodiment are merely illustrative. In some exemplary implementation, a corresponding structure may be changed and a patterning process may be increased or decreased according to actual needs. For example, a plurality of transparent conductive layers may be arranged, such as forming another transparent conductive layer on a side of the first planarization layer away from the base substrate, and forming a third planarization layer and an anode layer subsequently. However, this embodiment is not limited thereto.

In some examples, when the display substrate includes a plurality of transparent conductive layers, each transparent conductive layer can be provided with an auxiliary structure adjacent to the edge transparent conductive line to improve the exposure environment of the exposure process for preparing each transparent conductive layer (e.g., to reduce the reflection of light within the first via and reduce the exposure amount received by the first transparent conductive line), thereby affecting the line width of the transparent conductive line, and further improving the disconnection or the thinning of the transparent conductive line due to the reflection and focusing effect of the first conductive layer in the exposure process.

The manufacturing process of the exemplary embodiment may be implemented using an existing mature manufacturing device, and may be compatible well with an existing manufacturing process, simple in process implementation, easy to implement, high in a production efficiency, low in a production cost, and high in a yield.

The embodiment also provides a preparation method for the display substrate, comprising: forming a pixel circuit layer on the base substrate, wherein the pixel circuit layer comprises a plurality of pixel circuits, and the plurality of pixel circuits comprise a plurality of first pixel circuits; forming a first planarization layer on a side of the pixel circuit layer away from the base substrate; forming at least one transparent conductive layer on a side of the first planarization layer away from the base substrate; forming a plurality of first light-emitting elements on a side of the transparent conductive layer away from the base substrate. The base substrate includes a first display region and a second display region, wherein the first display region at least partially surrounds the second display region. A plurality of first light-emitting elements located in the second display region. The first planarization layer is located in the first display region and the second display region. The transparent conductive layer includes a plurality of first transparent conductive lines and at least one auxiliary structure, and a plurality of first light-emitting elements and a plurality of first pixel circuits are coupled through the plurality of first transparent conductive lines. An orthographic projection of the auxiliary structure on the base substrate is overlapped with an orthographic projection of at least one of the plurality of pixel circuits on the base substrate.

For the method for manufacturing the display substrate in this embodiment, reference may be made to descriptions of the aforementioned embodiments, and thus will not be repeated here.

At least one embodiment of the present disclosure further provides a display apparatus which includes the display substrate as described above.

Figure 29:
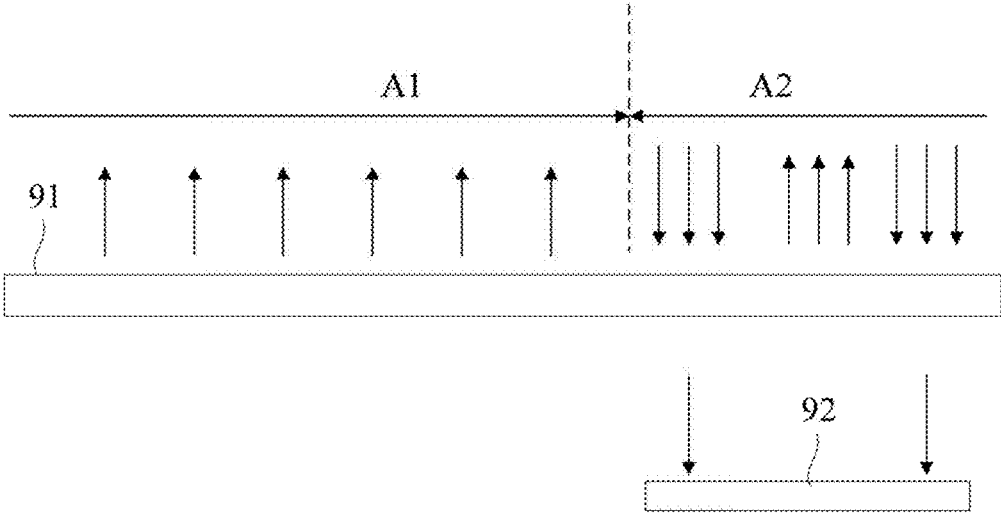
FIG. 29 is a schematic diagram of a display apparatus according to at least one embodiment of the present disclosure.

FIG. 29 is a schematic diagram of a display apparatus according to at least one embodiment of the present disclosure. As shown in FIG. 29, a display apparatus is provide in this embodiment, which includes a display substrate 91 and a photosensitive sensor 92 located on a light exit side of a display structure layer away from the display substrate 91. An orthographic projection of the photosensitive sensor 92 on the display substrate 91 is overlapped with the second display region A2.

In some exemplary implementations, the display substrate 91 may be a flexible OLED display substrate, a QLED display substrate, a Micro-LED display substrate or a Mini-LED display substrate. The display device may be any product or component with a display function such as an OLED display, a cell phone, a tablet, a television, a display, a laptop, a digital photo frame, a navigator, and so on, which is not limited in the embodiments of the present disclosure.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict.

Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A display substrate, comprising:
a base substrate including a first display region and a second display region, wherein the second display region is surrounded by at least a part of the first display region;
a pixel circuit layer located in the first display region, wherein the pixel circuit layer comprises a plurality of pixel circuits, and the plurality of pixel circuits comprise a plurality of first pixel circuits;
a plurality of first light-emitting elements located in the second display region;
a first planarization layer located on a side of the pixel circuit layer away from the base substrate, and located in the first display region and the second display region; and
at least one transparent conductive layer located on a side of the first planarization layer away from the base substrate,
wherein the transparent conductive layer comprises a plurality of first transparent conductive lines and at least one auxiliary structure, and the plurality of first light-emitting elements and the plurality of first pixel circuits are coupled through the plurality of first transparent conductive lines;
wherein an orthographic projection of the at least one auxiliary structure on the base substrate is overlapped with an orthographic projection of at least one of the plurality of pixel circuits on the base substrate;
wherein the display substrate further comprises a first conductive layer located between the pixel circuit layer and the first planarization layer, the first conductive layer comprises at least one shield electrode electrically connected with at least one of the plurality of pixel circuits, and an orthographic projection of the at least one auxiliary structure on the base substrate is overlapped with an orthographic projection of the shield electrode on the base substrate; and
wherein each pixel circuit at least comprises a drive transistor, a threshold compensation transistor and a first reset transistor, and the drive transistor, the threshold compensation transistor and the first reset transistor are all electrically connected to a first node; the first node is a connection point of the first reset transistor, the drive transistor, and the threshold compensation transistor; and the orthographic projection of the shield electrode on the base substrate is arranged to cover an orthographic projection of the first node of the pixel circuit on the base substrate.

2. The display substrate according to claim 1, wherein the pixel circuit layer comprises a second conductive layer, and the second conductive layer comprises a first power supply line, and the shield electrode is electrically connected with the first power supply line.

3. The display substrate according to claim 2, wherein the at least one auxiliary structure is electrically connected with the shield electrode.

4. The display substrate according to claim 1, wherein the orthographic projection of the shielding electrode on the base substrate is an irregular shape.

5. The display substrate according to claim 2, wherein the display substrate comprises a second planarization layer, the second planarization layer of the display substrate is provided between the first conductive layer and the second conductive layer, and the first conductive layer is electrically connected to the second conductive layer through a first via hole of the display substrate penetrating the second planarization layer; and an orthographic projection of at least one of the plurality of first transparent conductive lines on the base substrate is overlapped with an orthographic projection of the first via hole on the base substrate.

6. The display substrate according to claim 1, wherein the first transparent conductive lines comprise edge transparent conductive lines, and the edge transparent conductive line is adjacent to the at least one auxiliary structure.

7. The display substrate according to claim 6, wherein the at least one auxiliary structure is located between two of the edge transparent conductive lines.

8. The display substrate according to claim 6, wherein a spacing between the at least one auxiliary structure and an adjacent edge transparent conductive line is greater than or equal to 2 microns and less than or equal to 3 microns.

9. The display substrate according to claim 1, wherein the at least one auxiliary structure comprises a plurality of auxiliary blocks arranged regularly.

10. The display substrate according to claim 9, wherein the plurality of auxiliary blocks of the at least one auxiliary structure are arranged in an array, and shapes and sizes of the plurality of auxiliary blocks are substantially the same.

11. The display substrate according to claim 10, wherein an orthographic projection of each of the plurality of auxiliary blocks on the base substrate is rectangular.

12. The display substrate according to claim 9, wherein the plurality of auxiliary blocks of the at least one auxiliary structure are arranged in a ring.

13. The display substrate according to claim 9, wherein the pixel circuit layer comprises a second conductive layer, and the second conductive layer comprises a first power supply line, at least one auxiliary block of the at least one auxiliary structure is electrically connected to the first power supply line.

14. The display substrate according to claim 9, wherein at least two adjacent auxiliary blocks of the at least one auxiliary structure are connected through one connection line of the display substrate.

15. The display substrate according to claim 14, wherein the plurality of auxiliary blocks of the at least one auxiliary structure are divided into a plurality of groups, each group includes at least two auxiliary blocks, and the auxiliary blocks within one group are connected by one connection line of the display substrate or a plurality of connection lines of the display substrate.

16. The display substrate according to claim 1, wherein an orthographic projection of the at least one auxiliary structure on the base substrate is ring-shaped or mesh-shaped.

17. The display substrate according to claim 1, wherein the plurality of pixel circuits further comprises a plurality of second pixel circuits located in the first display region; the display substrate further comprises a plurality of second light-emitting elements located in the first display region; and at least one second pixel circuit of the plurality of second pixel circuits is electrically connected to at least one second light-emitting element of the plurality of second light-emitting elements, and the at least one second pixel circuit is configured to drive the at least one second light-emitting element.

18. A display apparatus, comprising a display substrate, wherein the display substrate comprises:

a base substrate including a first display region and a second display region, wherein the second display region is surrounded by at least a part of the first display region;

a pixel circuit layer located in the first display region, wherein the pixel circuit layer comprises a plurality of pixel circuits, and the plurality of pixel circuits comprise a plurality of first pixel circuits;

a plurality of first light-emitting elements located in the second display region;

a first planarization layer located on a side of the pixel circuit layer away from the base substrate, and located in the first display region and the second display region; and at least one transparent conductive layer located on a side of the first planarization layer away from the base substrate, wherein the transparent conductive layer comprises a plurality of first transparent conductive lines and at least one auxiliary structure, and the plurality of first light-emitting elements and the plurality of first pixel circuits are coupled through the plurality of first transparent conductive lines;

wherein an orthographic projection of the at least one auxiliary structure on the base substrate is overlapped with an orthographic projection of at least one of the plurality of pixel circuits on the base substrate;

wherein the display substrate further comprises a first conductive layer located between the pixel circuit layer and the first planarization layer, the first conductive layer comprises at least one shield electrode electrically connected with at least one of the plurality of pixel circuits, and an orthographic projection of the at least one auxiliary structure on the base substrate is overlapped with an orthographic projection of the shield electrode on the base substrate; and wherein each pixel circuit at least comprises a drive transistor, a threshold compensation transistor and a first reset transistor, and the drive transistor, the threshold compensation transistor and the first reset transistor are all electrically connected to a first node; the first node is a connection point of the first reset transistor, the drive transistor, and the threshold compensation transistor; and the orthographic projection of the shield electrode on the base substrate is arranged to cover an orthographic projection of the first node of the pixel circuit on the base substrate.

* * * * *